United States Patent
Vora

(10) Patent No.: US 7,692,220 B2
(45) Date of Patent: Apr. 6, 2010

(54) SEMICONDUCTOR DEVICE STORAGE CELL STRUCTURE, METHOD OF OPERATION, AND METHOD OF MANUFACTURE

(75) Inventor: Madhu P. Vora, Los Gatos, CA (US)

(73) Assignee: SuVolta, Inc., Los Gatos, CA (US)

( * ) Notice: Subject to any disclaimer, the term of this patent is extended or adjusted under 35 U.S.C. 154(b) by 251 days.

(21) Appl. No.: 11/799,572

(22) Filed: May 1, 2007

(65) Prior Publication Data

US 2008/0273398 A1 Nov. 6, 2008

(51) Int. Cl.
*H01L 29/80* (2006.01)
(52) U.S. Cl. .................. 257/256; 438/194; 438/186; 257/E27.148
(58) Field of Classification Search ......... 257/256–279, 257/E27.148; 438/186–196
See application file for complete search history.

(56) References Cited

U.S. PATENT DOCUMENTS

| | | | |
|---|---|---|---|
| 3,412,286 A | 11/1968 | Grebene |
| 3,930,300 A | 1/1976 | Nicolay |
| 3,951,702 A | 4/1976 | Kano et al. |
| 3,967,305 A | 6/1976 | Zuleeg |
| 3,971,055 A | 7/1976 | Arai |
| 4,036,672 A | 7/1977 | Kobayashi |
| 4,040,082 A | 8/1977 | Goser |
| 4,064,525 A | 12/1977 | Kano et al. |
| 4,126,899 A | 11/1978 | Lohstroh |
| 4,126,900 A | 11/1978 | Koomen et al. |
| 4,228,367 A | 10/1980 | Brown |
| 4,333,224 A | 6/1982 | Buchanan |
| 4,485,392 A | 11/1984 | Singer |
| 4,613,772 A | 9/1986 | Young |
| 4,638,344 A | 1/1987 | Cardwell, Jr. |
| 4,698,653 A | 10/1987 | Cardwell, Jr. |
| 4,751,556 A | 6/1988 | Cogan et al. |
| 4,791,611 A | 12/1988 | Eldin et al. |
| 4,853,561 A | 8/1989 | Gravrok |

(Continued)

FOREIGN PATENT DOCUMENTS

EP 0 050 772 A2 5/1982

(Continued)

OTHER PUBLICATIONS

U.S. Appl. No. 11/799,572, Vora, Madhukar P.

(Continued)

*Primary Examiner*—Richard A. Booth
(74) *Attorney, Agent, or Firm*—Haverstock & Owens, LLP

(57) ABSTRACT

The invention can include at least one storage cell having a store gate structure formed from a semiconductor material doped to a first conductivity type and in contact with a channel region comprising a semiconductor material doped to a second conductivity type. A storage cell can also include at least a first source/drain region and a second source/drain region separated from one another by the channel region. A control gate structure, comprising a semiconductor layer doped to the first conductivity type can be formed over a substrate surface. The control gate structure can be in contact with the channel region. Such a storage cell can be more compact and/or provide longer data retention times than conventional storage cells, such as many conventional dynamic random access memory (DRAM) type cells.

17 Claims, 15 Drawing Sheets

U.S. PATENT DOCUMENTS

| | | | |
|---|---|---|---|
| 5,010,025 A * | 4/1991 | Solomon | 438/188 |
| 5,130,770 A | 7/1992 | Blanc et al. | |
| 5,243,209 A | 9/1993 | Ishii | |
| 5,618,688 A | 4/1997 | Reuss | |
| 5,764,096 A | 6/1998 | Lipp et al. | |
| 5,773,891 A | 6/1998 | Delgado | |
| 5,973,341 A | 10/1999 | Letavic et al. | |
| 6,307,223 B1 | 10/2001 | Yu | |
| 2002/0197779 A1 | 12/2002 | Evans | |
| 2004/0222475 A1 | 11/2004 | Hao | |

FOREIGN PATENT DOCUMENTS

| | | |
|---|---|---|
| EP | 0193842 | 9/1986 |
| GB | 2208967 A | 4/1989 |
| JP | 57 132368 | 8/1982 |
| JP | 60-258948 | 12/1985 |
| JP | 60258948 A | 12/1985 |
| WO | WO 88/08617 A | 11/1988 |

OTHER PUBLICATIONS

Takagi et al., "Complementary JFET Negative-Resistance Devices", *IEEE Journal of Solid-State Circuits*, Dec. 1975, pp. 509-515, vol. SC-10, No. 6.

Heald et al., "Multilevel Random-Access Memory Using One Transistor Per Cell", *IEEE Journal of Solid-State Circuits*, Aug. 1976, pp. 519-528, vol. SC-11, No. 4.

PCT International Search Report and Written Opinion for International Application No. PCT/US2008/016949.

* cited by examiner

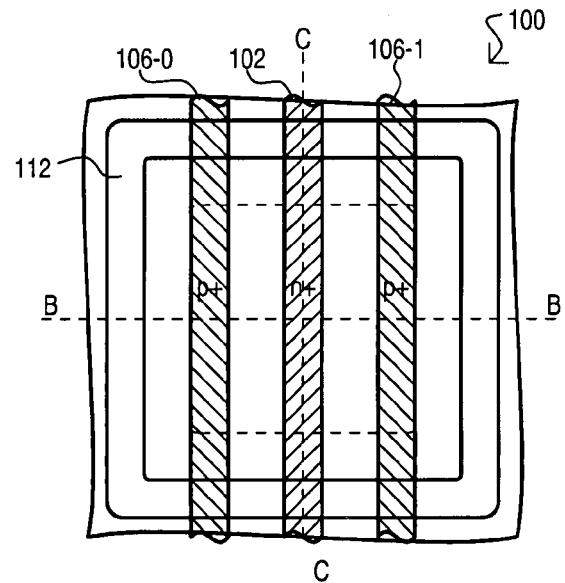
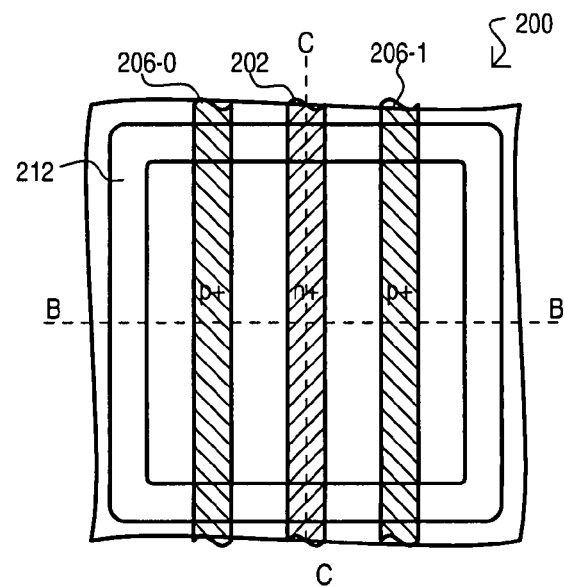
FIG. 1A    FIG. 2A
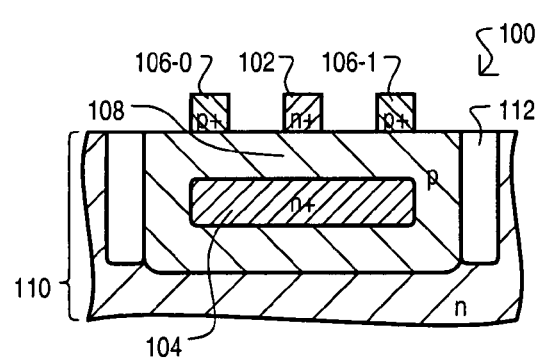
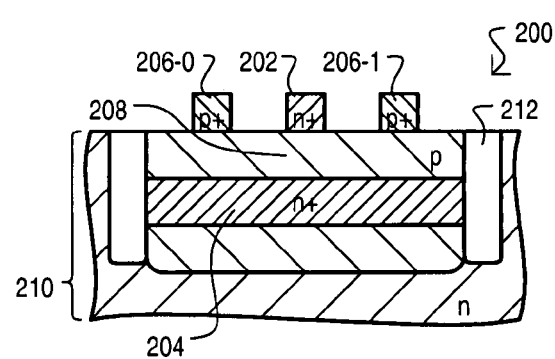
FIG. 1B    FIG. 2B
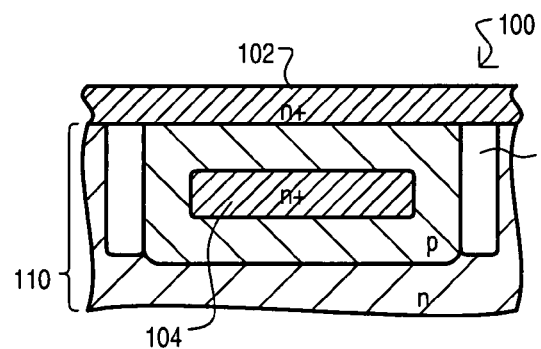
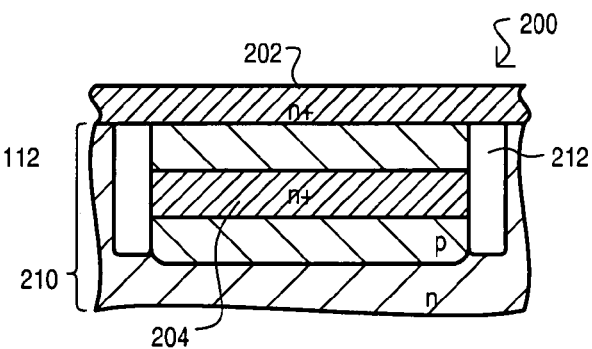
FIG. 1C    FIG. 2C

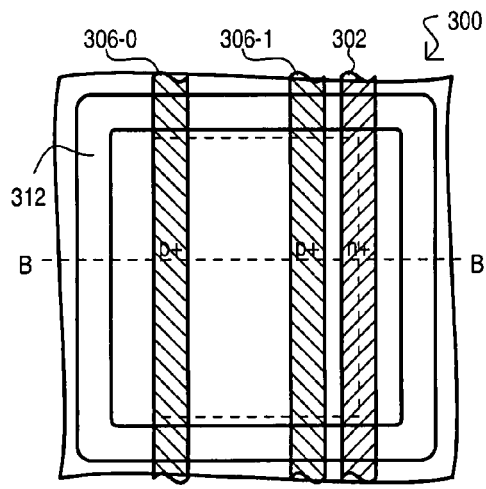
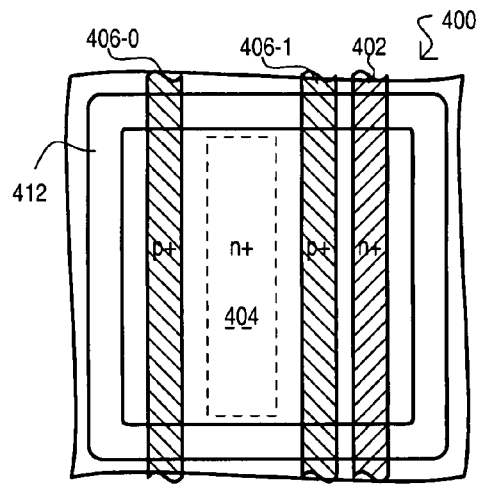
FIG. 3A    FIG. 4A
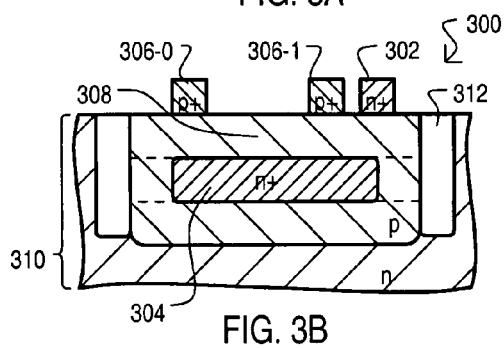
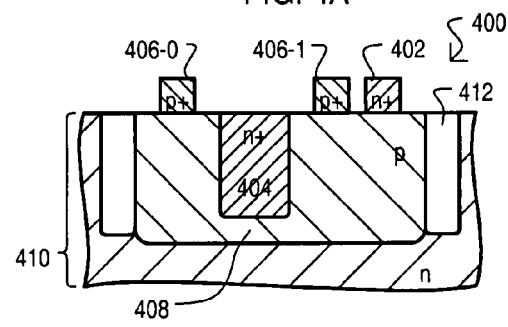
FIG. 3B    FIG. 4B
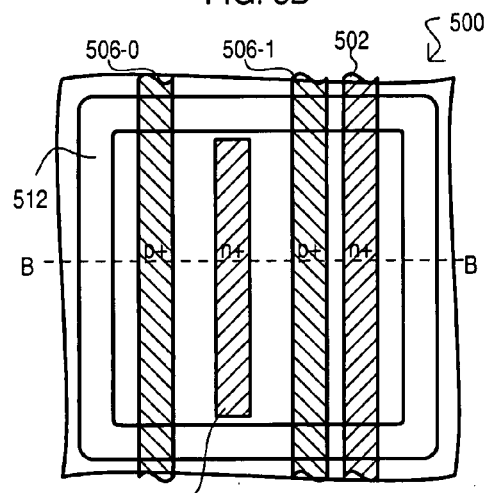
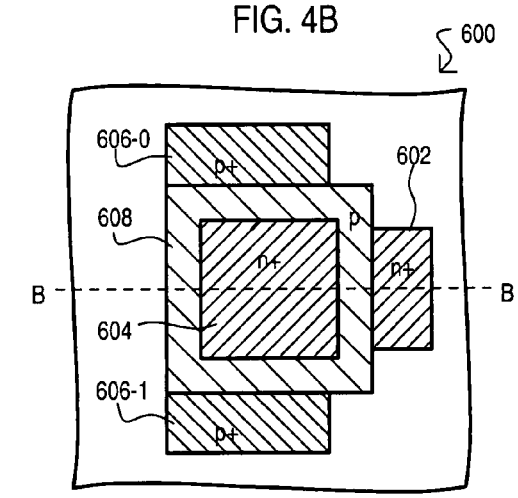
FIG. 5A    FIG. 6A
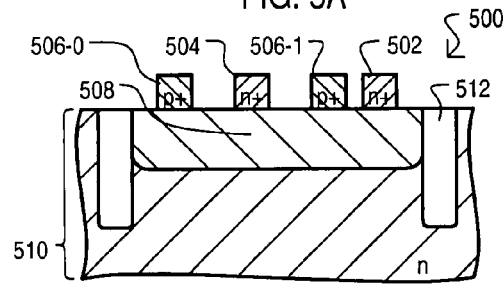
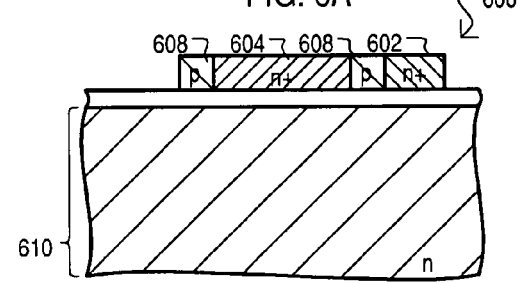
FIG. 5B    FIG. 6B

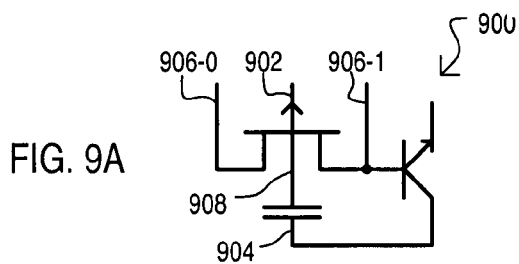
FIG. 9A
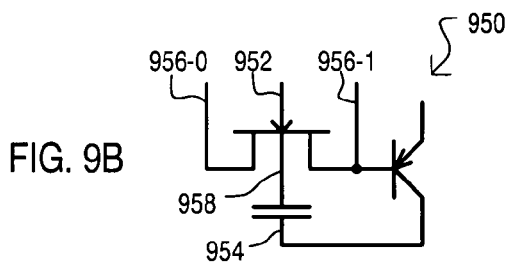
FIG. 9B
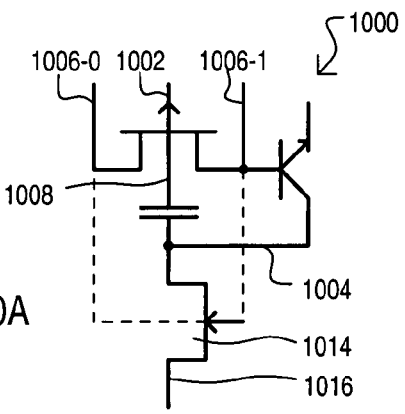
FIG. 10A
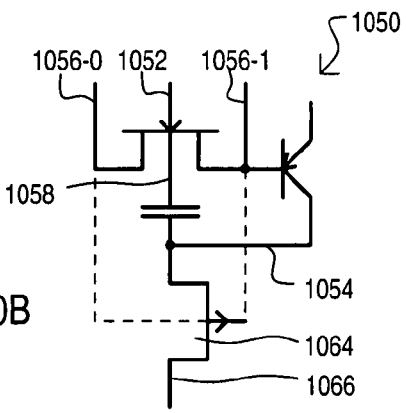
FIG. 10B
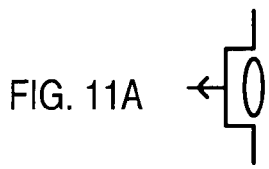
FIG. 11A
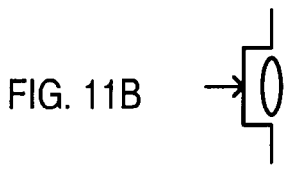
FIG. 11B
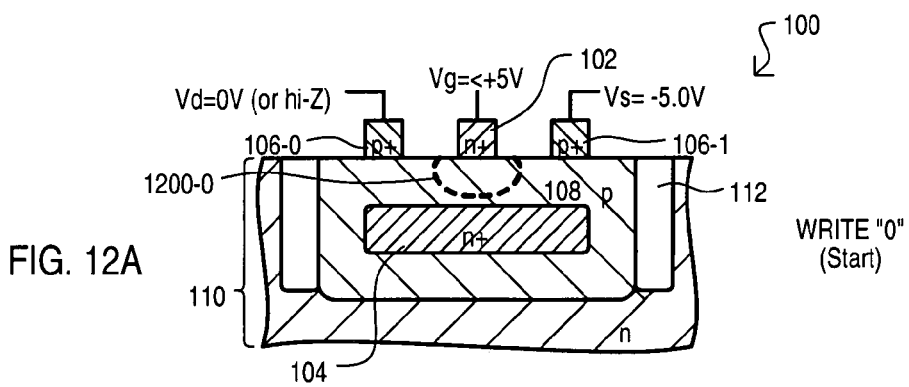
FIG. 12A — WRITE "0" (Start)
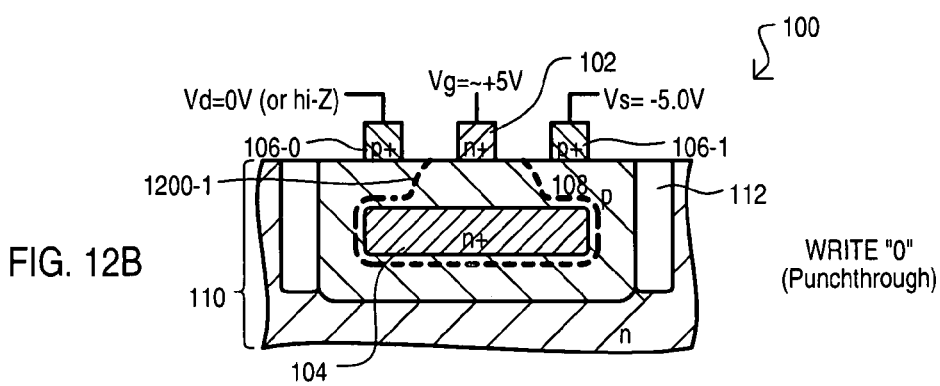
FIG. 12B — WRITE "0" (Punchthrough)

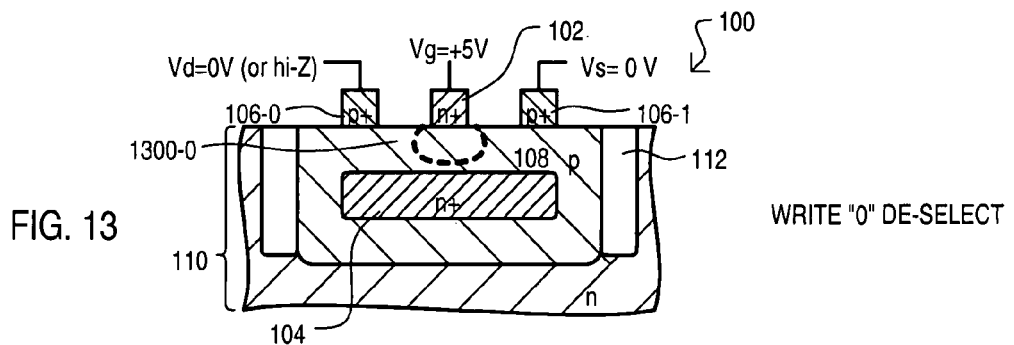
FIG. 13     WRITE "0" DE-SELECT
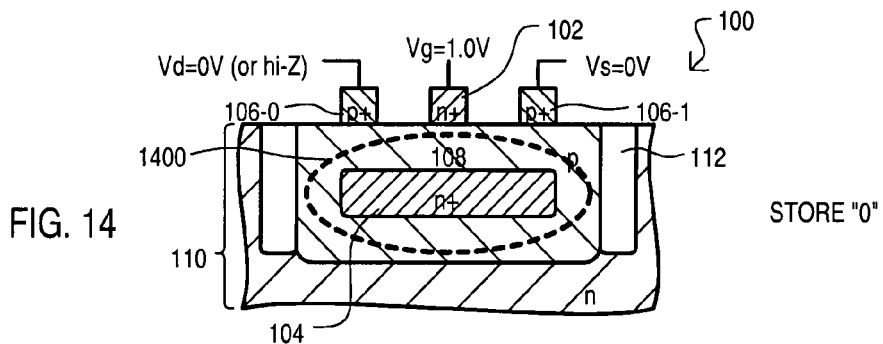
FIG. 14     STORE "0"
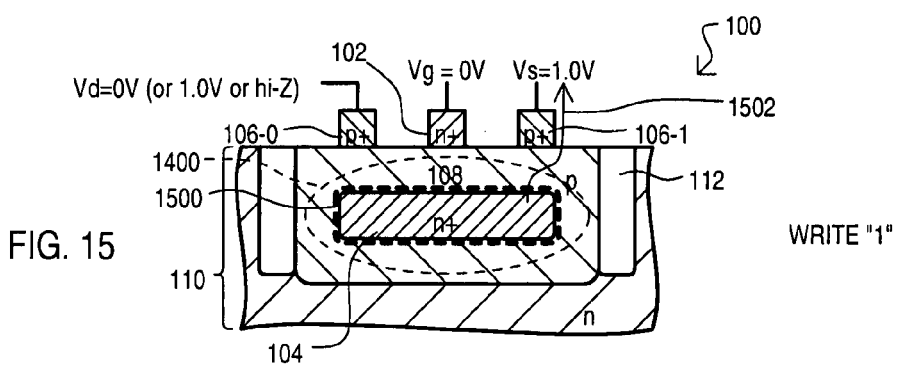
FIG. 15     WRITE "1"
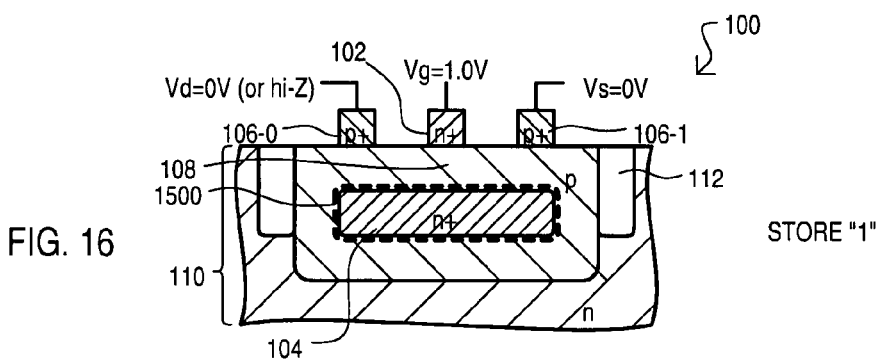
FIG. 16     STORE "1"

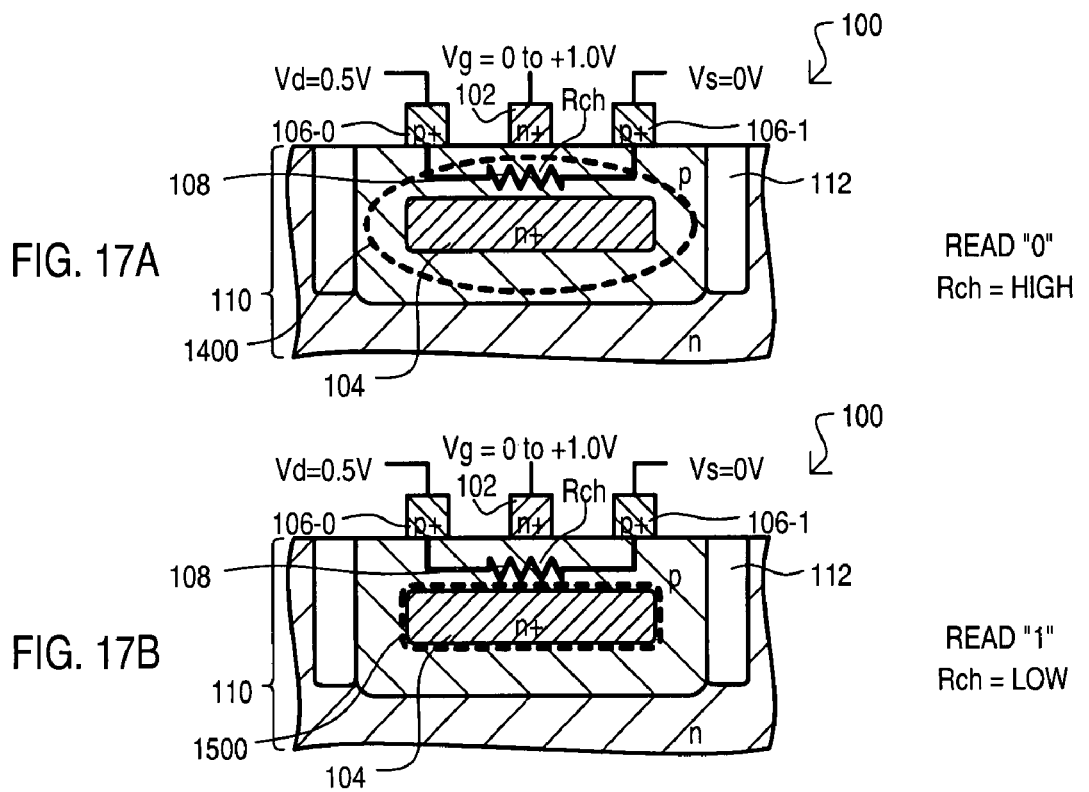
FIG. 17A  READ "0"  Rch = HIGH
FIG. 17B  READ "1"  Rch = LOW
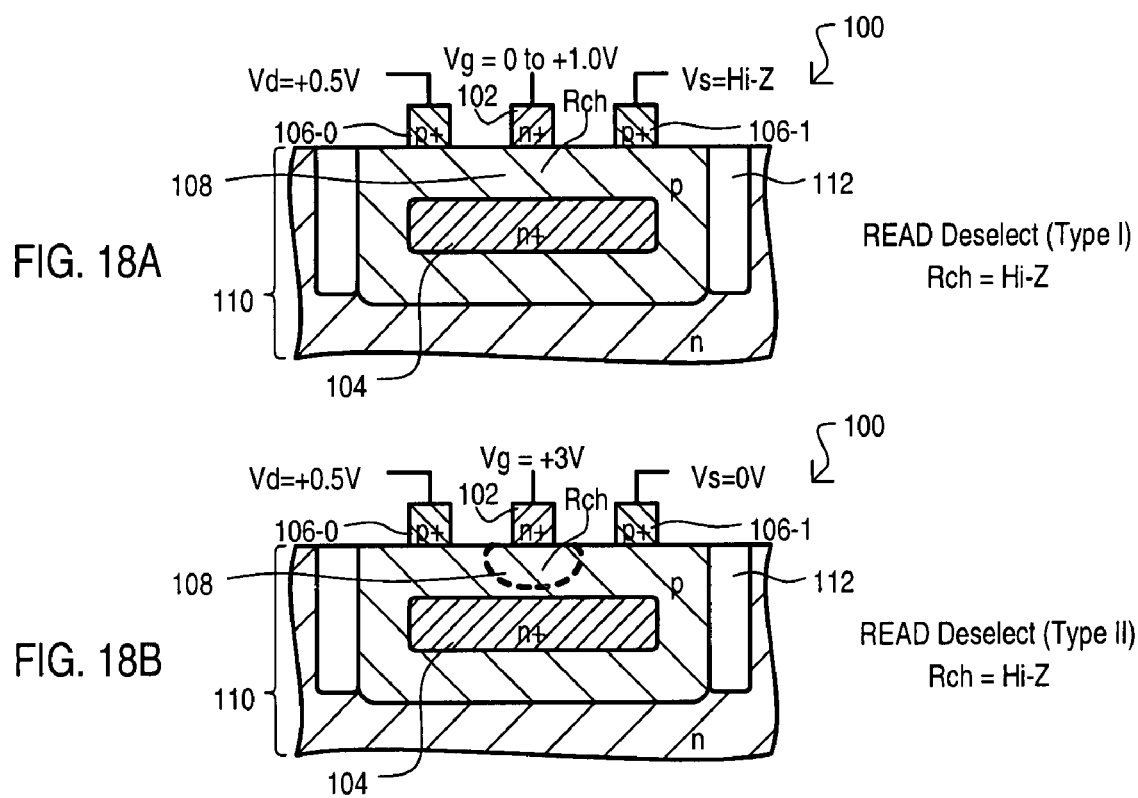
FIG. 18A  READ Deselect (Type I)  Rch = Hi-Z
FIG. 18B  READ Deselect (Type II)  Rch = Hi-Z

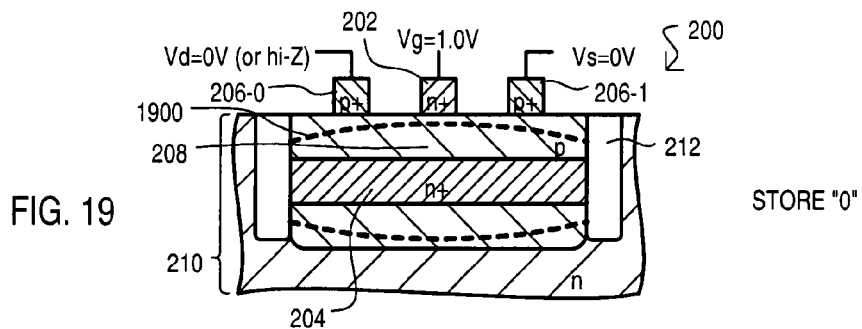
FIG. 19　STORE "0"
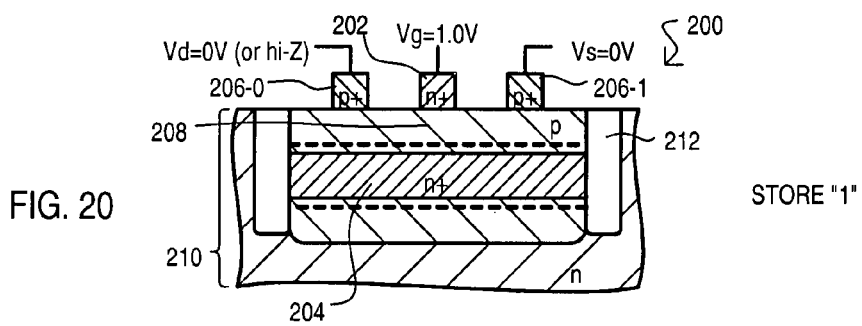
FIG. 20　STORE "1"
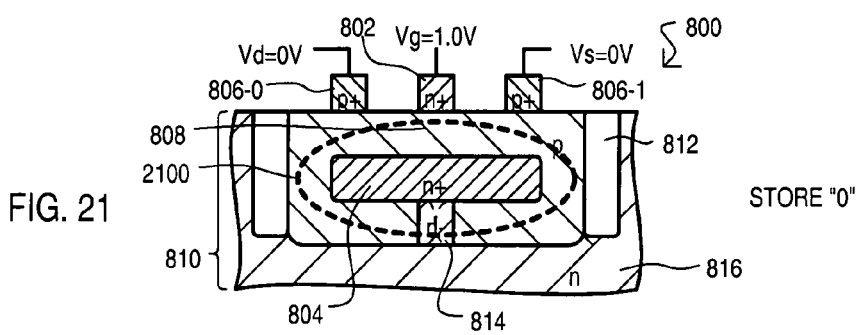
FIG. 21　STORE "0"
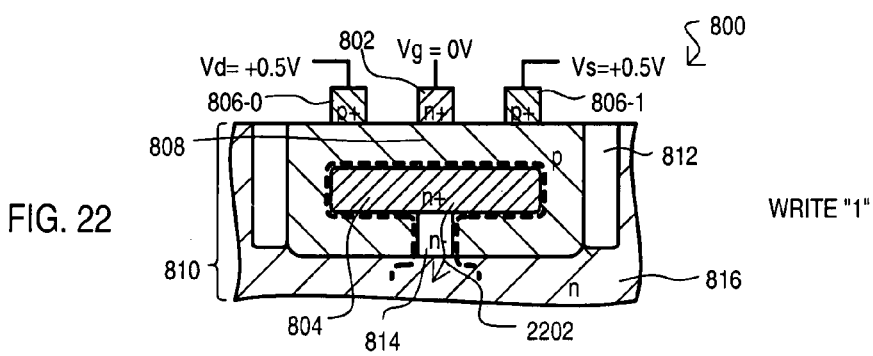
FIG. 22　WRITE "1"
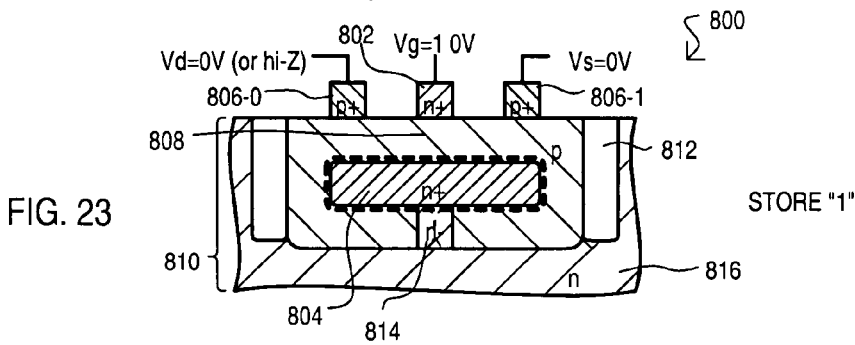
FIG. 23　STORE "1"

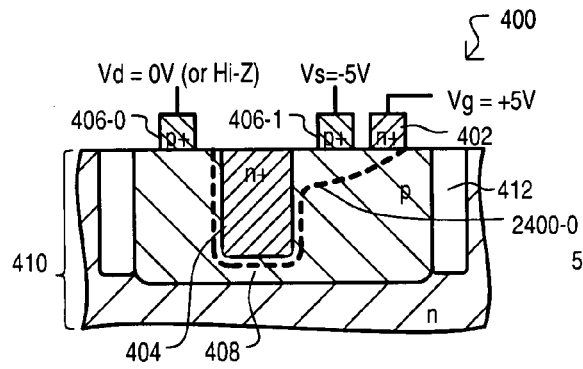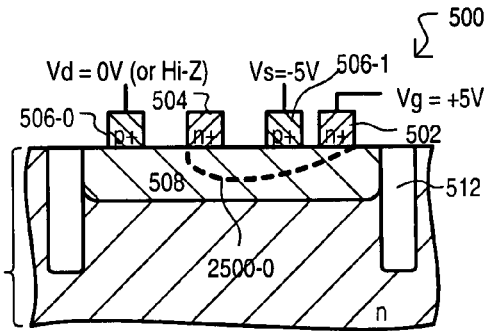
(WRITE "0")
FIG. 24A FIG. 25A
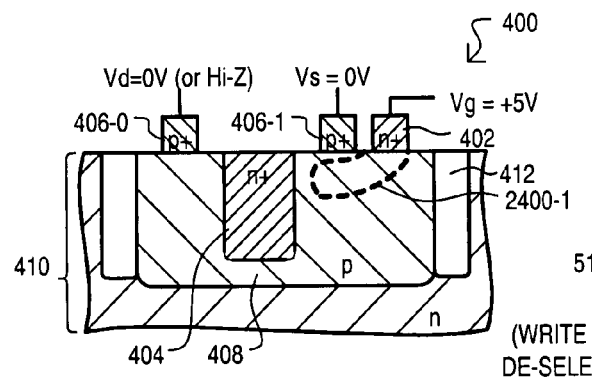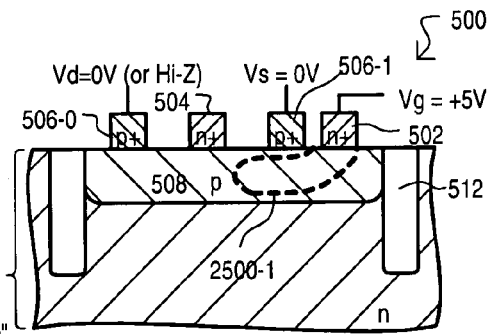
(WRITE "0" DE-SELECT)
FIG. 24B FIG. 25B
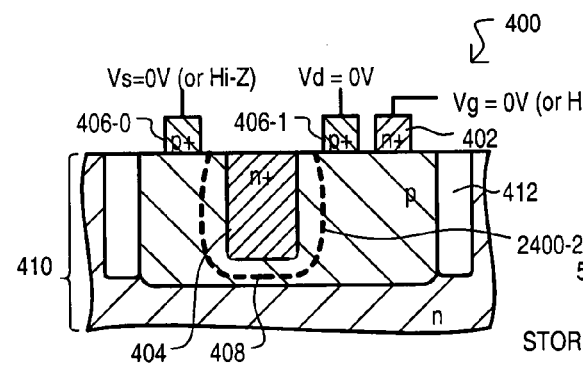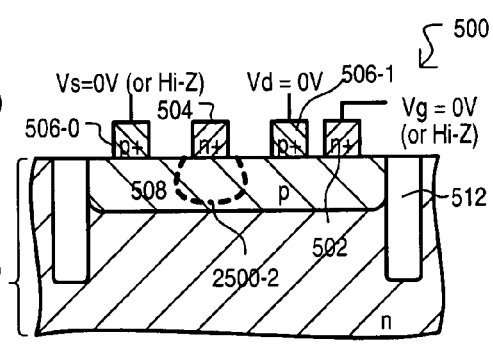
STORE
FIG. 24C FIG. 25C
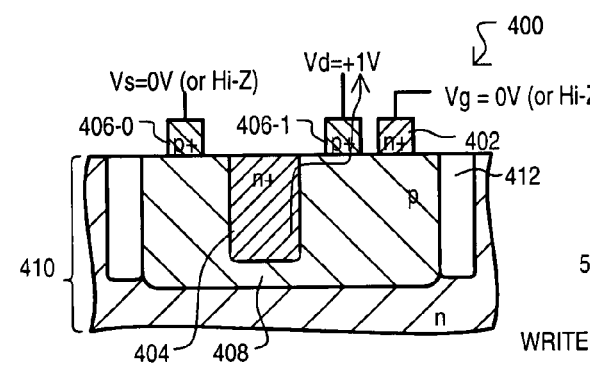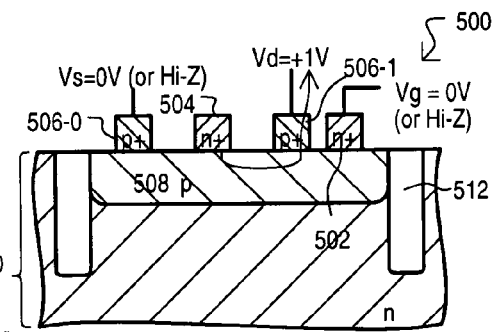
WRITE "1"
FIG. 24D FIG. 25D

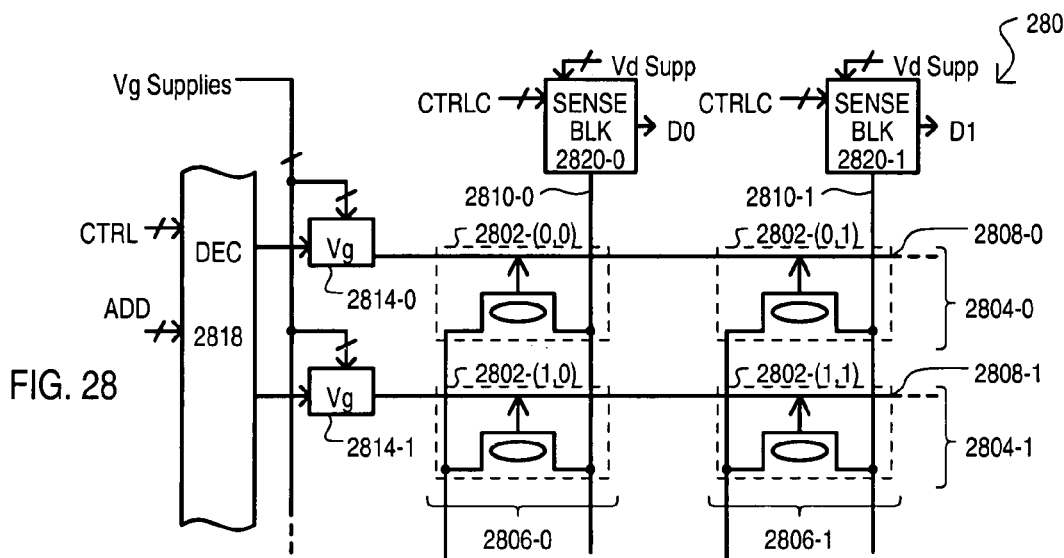
FIG. 28
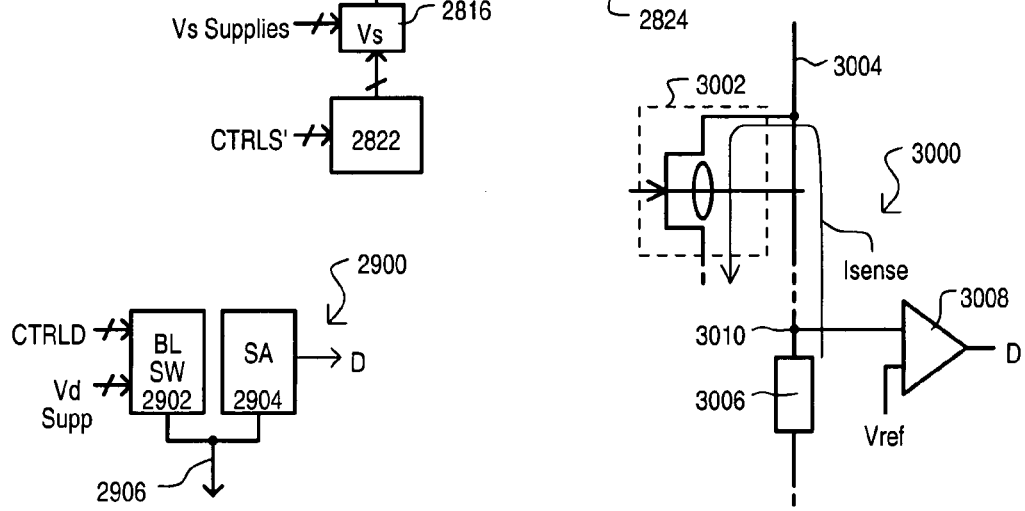
FIG. 29                    FIG. 30
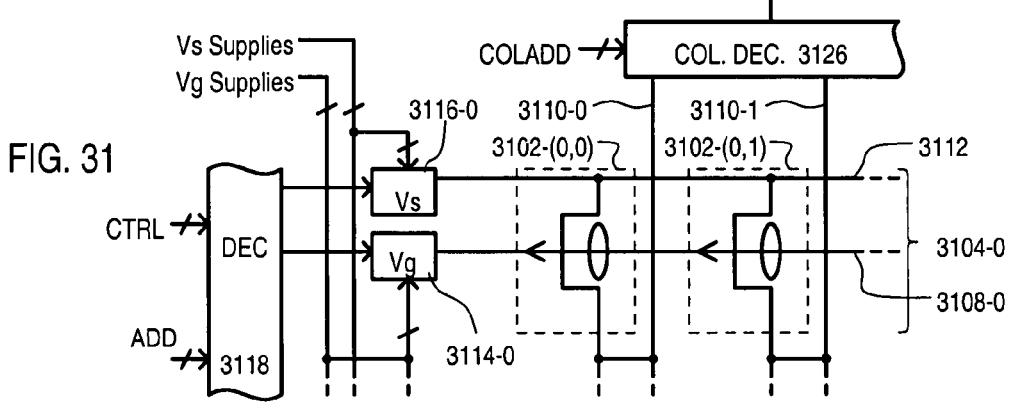
FIG. 31

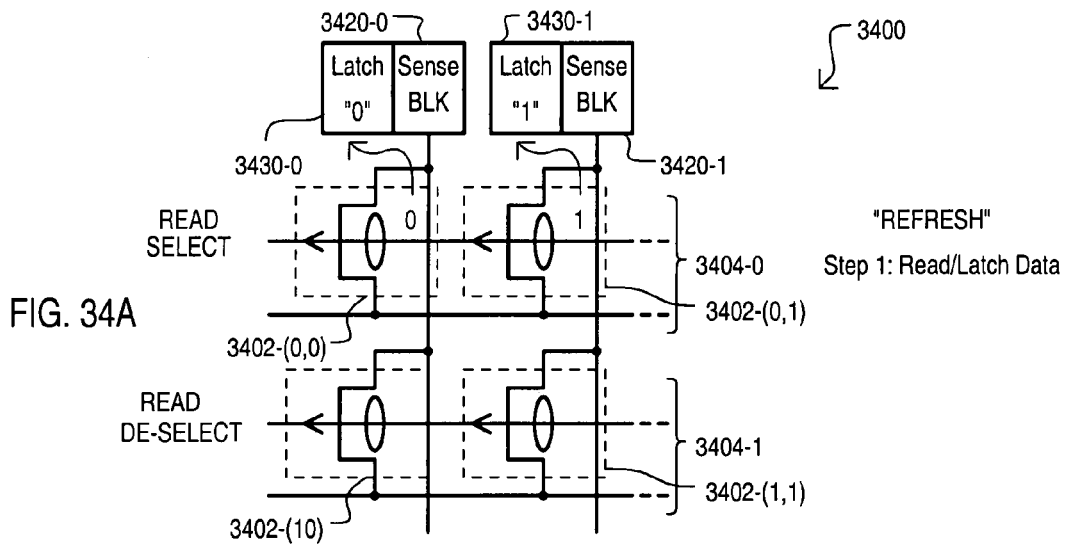
FIG. 34A  "REFRESH" Step 1: Read/Latch Data
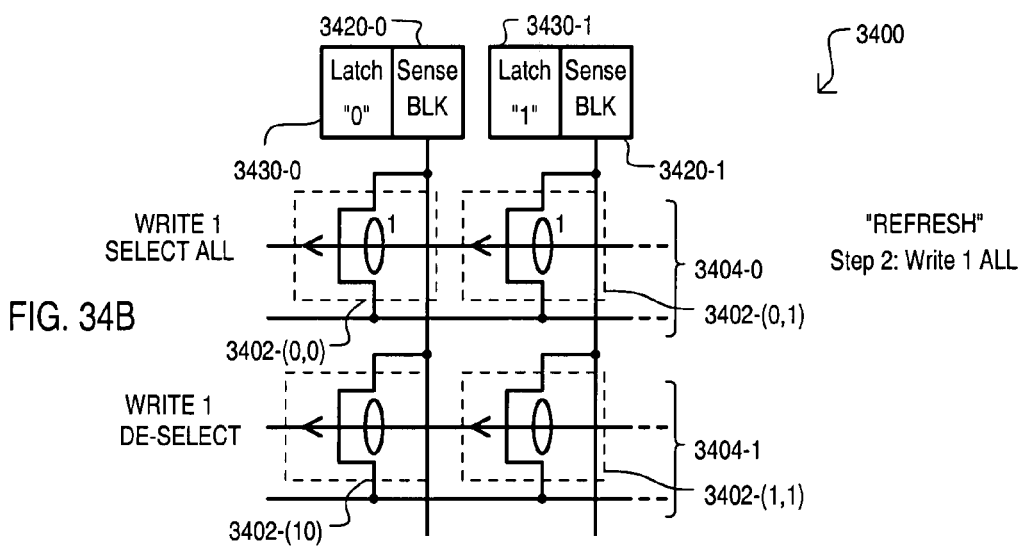
FIG. 34B  "REFRESH" Step 2: Write 1 ALL
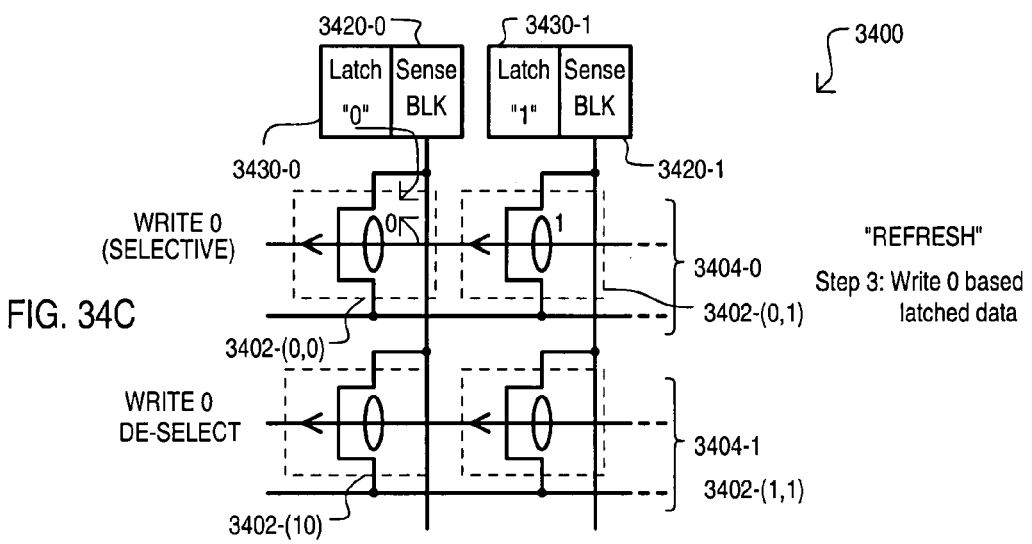
FIG. 34C  "REFRESH" Step 3: Write 0 based latched data

SEMICONDUCTOR DEVICE STORAGE CELL STRUCTURE, METHOD OF OPERATION, AND METHOD OF MANUFACTURE

TECHNICAL FIELD

The present invention relates generally to electronic storage devices, and more particularly to storage cells for storing data in a semiconductor integrated circuit device.

BACKGROUND OF THE INVENTION

An important feature of many integrated circuit (IC) devices can be the ability to store a data value. Numerous examples of conventional storage devices are known, including nonvolatile storage devices and volatile storage devices. Volatile storage devices can include static random access memories (SRAMs) as well as dynamic RAMs (DRAMs). DRAMs are often preferred in many applications due to their lower power consumption and smaller cell size.

A typical conventional DRAM cell includes a metal-oxide-semiconductor (MOS) pass transistor and a storage capacitor. A DRAM capacitor can have many configurations. As but one example, a DRAM capacitor can be a "trench" capacitor formed in a substrate. Thus, in such arrangements substrate area must be dedicated for both the storage capacitor and the corresponding pass transistor. Alternatively, capacitors can be formed over a substrate, including capacitor-over-bit line architectures, in which the capacitor extends over a bit connected to each cell of a column, and bit-line-over-capacitor architectures, in which the capacitors extends below the bit lines of each column. A drawback to such arrangements can be the complexity involved in manufacturing the capacitor structures. For devices having capacitors formed over a substrate, a cell must still include a contact location to connect one plate of the capacitor to the corresponding pass transistor.

For DRAM memory cells, a charge state of the capacitor corresponds to the data value stored. However, because charge can leak from a DRAM capacitor, such cells require a periodic "refresh". This is one drawback to DRAM memories, the need to refresh data values periodically in order to ensure data values are not lost.

Another type of memory cell, capable of storing multilevel analog information is disclosed in "Multilevel Random—Access Memory Using One Transistor Per Cell", *IEEE Journal of Solid-State Circuits*, Vol. SC-11, No. 4, August 1976, by Heald et al.

BRIEF SUMMARY OF THE INVENTION

The present invention can include a semiconductor device having one or more storage cells. Each storage cell can include a store gate structure formed from a semiconductor material doped to a first conductivity type that is in contact with a channel region comprising a semiconductor material doped to a second conductivity type. A first source (or drain) region and a second drain (or source) region can be separated from one another by the channel region. A control gate structure, comprising a semiconductor layer doped to the first conductivity type and formed over a substrate surface, can be in contact with the channel region.

The present invention can also include an integrated circuit operating method, comprising the steps of: storing a first predetermined value in at least a first storage cell by applying a first gate voltage to a gate terminal of the first storage cell and a first source voltage to a source of the storage cell, the gate terminal comprising a semiconductor material doped to a first conductivity type and formed on a substrate surface, the first gate and source voltages creating a punchthrough voltage through a semiconductor region of a second conductivity type that charges a store gate comprising a semiconductor material doped to the first conductivity type; and determining the data value stored in the storage cell according to the magnitude of a current flowing through a channel region of the first storage cell, the channel region comprising a semiconductor material doped to the second conductivity type that is adjacent to the store gate.

The present invention can further include a method of fabricating an integrated circuit device storage cell. Such a method can include forming a channel region comprising a semiconductor material doped to a first conductivity type and forming a store gate structure comprising a semiconductor material doped to a second conductivity type. The store gate structure can be in contact with the channel region. The method can also include forming a control gate terminal from at least a portion of a semiconductor layer deposited on a substrate surface in contact with the channel region. Such a portion of the semiconductor layer can be doped to the second conductivity type.

BRIEF DESCRIPTION OF THE DRAWINGS

FIGS. 1A to 1C are various views showing a storage cell according to a first embodiment of the present invention.

FIGS. 2A to 2C are various views showing a storage cell according to a second embodiment of the present invention.

FIGS. 3A and 3B are views showing a storage cell according to a third embodiment of the present invention.

FIGS. 4A and 4B are views showing a storage cell according to a fourth embodiment of the present invention.

FIGS. 5A and 5B are views showing a storage cell according to a fifth embodiment of the present invention.

FIGS. 6A and 6B are views showing a storage cell according to a sixth embodiment of the present invention.

FIGS. 9A and 9B are schematic diagram representations of storage cells like those shown by FIGS. 1A to 7B.

FIGS. 10A and 10B are schematic diagram representations of storage cells like those shown by FIGS. 8A to 8C.

FIGS. 11A and 11B are symbolic representations of storage cells according to the various embodiments.

FIGS. 12A and 12B show write operations for one value according to an embodiment.

FIG. 13 shows a write de-select operation according to an embodiment.

FIG. 14 shows a store operation for one value according to an embodiment.

FIG. 15 shows a write operation for another value according to an embodiment.

FIG. 16 shows a store operation for another value according to an embodiment.

FIGS. 17A and 17B show read operations according to an embodiment.

FIGS. 18A and 18B show read de-select operations according to an embodiment.

FIG. 19 shows a store operation for one value according to another embodiment.

FIG. 20 shows a store operation for another value according to another embodiment.

FIG. 21 shows a store operation for one value according to yet another embodiment.

FIG. 22 shows a write operation for another value according to another embodiment.

FIG. 23 shows a store operation for another value according to yet another embodiment.

FIGS. 24A to 24D show write, write de-select and store operations according to another embodiment.

FIGS. 25A to 25D show write, write de-select and store operations according to still another embodiment.

FIG. 28 shows a memory device according to another embodiment.

FIG. 29 shows a sense block that can be included in embodiments of the invention.

FIG. 30 is a schematic diagram showing one example of sense amplifier that can be included in the embodiments.

FIG. 31 is a schematic diagram showing a memory device having a column decoder according to an embodiment.

FIGS. 34A to 34C are schematic diagrams showing a refresh operation according to an embodiment.

DETAILED DESCRIPTION OF THE EMBODIMENTS

Figure 7A:
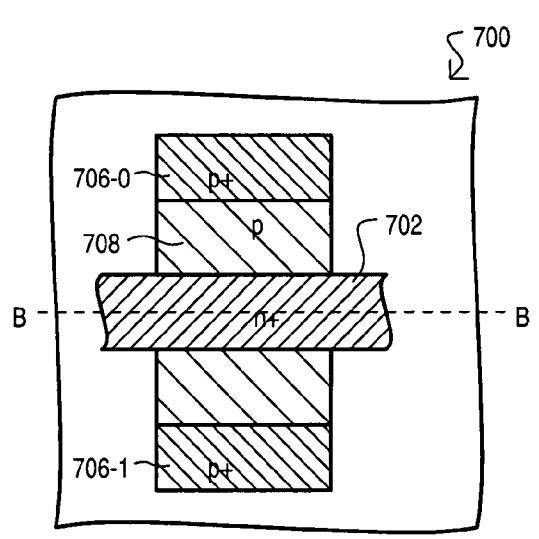
FIGS. 7A and 7B are views showing a storage cell according to a seventh embodiment of the present invention.

Various embodiments of the present invention will now be described in detail with reference to a number of drawings. The embodiments show structures, methods of operation, and methods of manufacture for a storage cell that can require a less frequent refresh operation, can be compact in size, and does not include a contact for a capacitor.

Referring now to FIGS. 1A to 1C, a storage cell according to a first embodiment is shown in a series of views, and designated by the general reference character 100. FIG. 1A is a top plan view of storage cell 100. FIG. 1B is a side cross sectional view taken along line B-B of FIG. 1A. FIG. 1C is a side cross sectional view taken along line C-C of FIG. 1A.

As shown in the various views, a storage cell 100 can include a control gate 102, a store gate 104, a first source/drain 106-0, a second source/drain 106-1, and a channel region 108. A storage cell 100 can be formed in a substrate 110, and can be bounded by an isolation structure 112.

A control gate 102 can be patterned from a semiconductor layer formed on a surface of a substrate 110, and can be doped to one conductivity type (in this example, n-type). In the particular example shown, control gate 102 can extend over, and be in physical contact with channel region 108 between opposing ends of isolation structure 112.

A store gate 104 can be formed from a semiconductor material doped to a same conductivity type as control gate 102, and can be separated from control gate 104 by a semiconductor material of opposite doping type (in this case p-type channel 108). Further, a store gate 104 can be adjacent to a channel region 108, and thus can vary the resistance of channel region 108 according to the amount of charge stored by store gate 104. In such an arrangement, a store gate 104 may retain charge longer than a typical DRAM capacitor cell, as the region is surrounded by oppositely doped semiconductor material. Thus, a refresh operation can occur with less frequency than a conventional DRAM, allowing for higher performance and/or lower power consumption.

In the very particular example of FIGS. 1A to 1C, store gate 104 can be highly doped n+ region within, and surrounded by a p-type substrate area that includes channel region 108. However, as will be noted before, the present invention should not be limited to a particular conductivity type device, and can include devices having n-channel configurations, as well.

First and second source/drains (106-0 and 106-1) can be doped to a conductivity type opposite to that of control gate 102, and separated from one another by channel region 108. In the very particular example of FIGS. 1A to 1C, first and second source/drains (106-0 and 106-1) can be patterned from a semiconductor layer formed on a surface of a substrate 110, and preferably patterned from the same layer as control gate 102.

In such an arrangement, a storage cell 100 can be conceptualized as including a junction field effect transistor (JFET) having a channel between first source/drain 106-0 and second source/drain 106-1, the conductivity of which can be controlled by a potential applied to control gate 102, the amount of charge stored on store gate 104, or both.

It is noted that in a storage cell JFET as discussed above, one source/drain terminal (i.e., the first or second) can function as a transistor source, while another source/drain terminal (i.e., the second or first) can function as a transistor drain. However, the functionality of the terminal can depend upon which direction current is flowing, and hence can vary according to application and/or architecture in which such a storage cell is employed. Thus, the term "source/drain" is intended to convey this variability.

In a preferred embodiment, a storage cell 100 can be composed of doped silicon sections. In particular, a substrate 110 can be a monocrystalline silicon substrate that includes a relatively lightly doped channel region 108 and heavily doped store gate 104 region. In addition, control gate 102 and first and second source/drains (106-0 and 106-1) can include heavily doped polycrystalline silicon (polysilicon) or amorphous silicon. In such an arrangement, a control gate 102 and source/drains (106-0 and 106-1) may also include portions of the substrate directly below resulting from outdiffusion of dopants. That is, in the very particular example of FIGS. 1A to 1C, a control gate 102 can include a very shallow, heavily doped n+ region extending into substrate 110. Similarly, source/drains (106-0 and 106-1) can include very shallow, heavily doped p+ region extending into substrate 110.

As noted above, while FIGS. 1A to 1C show a storage cell having a p-channel JFET configuration, other embodiments can include an n-channel JFET configuration having conductivity types opposite to that shown in FIGS. 1A to 1C.

It is noted that the arrangement of FIGS. 1A to 1C can provide a compact cell size, as the storage structure (e.g., store gate 104) is formed below the transistor structure. This is in contrast to trench type DRAMs in which a pass transistor is typically positioned adjacent to the capacitor in a substrate. Further, no contact area needs to be designated for connection to the storage structure, as in the case of a conventional capacitor over/under bit line arrangement. In addition, control terminals (i.e., control gate, source, drain) for the JFET device can be formed by a patterned layer (e.g., polysilicon), rather than diffused areas in a substrate.

Referring now to FIGS. 2A to 2C, a storage cell according to a second embodiment is shown in a series of views, and designated by the general reference character 200. FIGS. 2A to 2C show the same general views as FIGS. 1A to 1C. Further, a storage cell 200 can include some of the same general structures as storage cell 100. Accordingly, like structures will be referred to by the same reference character but with the first digit being a "2" instead of a "1".

Storage cell 200 can differ from that of FIGS. 1A to 1C in that a store gate 204 is not completely surrounded by oppositely doped semiconductor material, and can abut isolation structure 212. Such an arrangement can result in greater charge leakage than the embodiment of FIGS. 1A to 1C, but may still provide for slower refresh rates than conventional DRAMs. In addition, a storage cell 200 may be more easily manufactured, by requiring fewer masks, or may provide more uniform performance as a storage gate position 204 may vary less according to mask alignment.

While FIGS. 2A to 2C show a store gate 204 that can contact all sides of isolation structure 212, alternate arrangements can include a store gate contacting only one portion of an isolation structure.

Referring now to FIGS. 3A and 3B, a storage cell according to a third embodiment is shown in a series of views, and designated by the general reference character 300. FIGS. 3A and 3B show the same general views as FIGS. 1A and 1B. Further, a storage cell 300 can include some of the same general structures as storage cell 100. Accordingly, like structures will be referred to by the same reference character but with the first digit being a "3" instead of a "1".

Storage cell 300 can differ from that of FIGS. 1A to 1C, in that a position of control gate 304 can be different. In the case of FIGS. 1A to 1C, a control gate 104 is situated between first and second source/drains (106-0 and 106-1) in a direction parallel to a surface of substrate 110 (considered herein the lateral direction). In the arrangement of FIGS. 3A and 3B, a control gate 304 is not situated between source/drains (306-0 and 306-1), but rather to one side of both such structures in the lateral direction.

In an arrangement like that of FIGS. 3A and 3B, conductivity of a channel region 308 may not be affected by control gate 302, but varied according the amount of charge on store gate 304.

It is noted that a store gate 304 can have forms like any of those described with reference to FIGS. 1A to 2C. FIG. 3B thus includes dashed lines showing that a store gate 304 can extend in a lateral direction to abut with any portion or all of isolation structure 312.

While the above embodiments have shown arrangements in which a store gate can be included formed within a substrate, entirely below a substrate surface, other embodiments can include store gates at or above a substrate surface. Various examples will now be described.

Referring now to FIGS. 4A and 4B, a storage cell according to a fourth embodiment is shown in a series of views, and designated by the general reference character 400. FIGS. 4A and 4B show the same general views as FIGS. 3A and 3B. Further, a storage cell 400 can include some of the same general structures as storage cell 300. Accordingly, like structures will be referred to by the same reference character but with the first digit being a "4" instead of a "3".

Storage cell 400 can differ from that of FIGS. 3A and 3B, in that a store gate 404 may not be completely below a surface of substrate 410. In such an arrangement, a channel 408 can exist below store gate 404.

Referring now to FIGS. 5A and 5B, a storage cell according to a fifth embodiment is shown in a series of views, and designated by the general reference character 500. FIGS. 5A and 5B show the same general views as FIGS. 4A and 4B. Further, a storage cell 500 can include some of the same general structures as storage cell 500. Accordingly, like structures will be referred to by the same reference character but with the first digit being a "5" instead of a "4".

Storage cell 500 can differ from that of FIGS. 4A and 4B, in that a store gate 504 may extend above a surface of substrate 510. In one particular arrangement, a store gate 504 can be patterned from a semiconductor layer formed on a surface of a substrate 510, and is preferably patterned from the same layer as control gate 502 and/or source/drains (506-0 and 506-1).

Referring now to FIGS. 6A and 6B, a storage cell according to a sixth embodiment is shown in a series of views, and designated by the general reference character 600. FIGS. 6A and 6B show the same general views as FIGS. 1A and 1B. Further, a storage cell 600 can include some of the same general structures as storage cell 100. Accordingly, like structures will be referred to by the same reference character but with the first digit being a "6" instead of a "1".

Storage cell 600 can differ from that of FIGS. 1A and 1B, in that a store gate 604 and channel 608 may be formed over a surface of substrate 610. In one particular arrangement, a control gate 602, store gate 604, source/drains (606-0 and 606-1), and channel region 608 can all be portions of a semiconductor layer formed over a surface of a substrate 610.

While the arrangement of FIGS. 6A and 6B show a storage cell that can be formed on a surface with a single layer, other embodiments can utilize multiple layers. One possible example of such an arrangement is shown in FIGS. 7A and 7B.

Figure 7B:
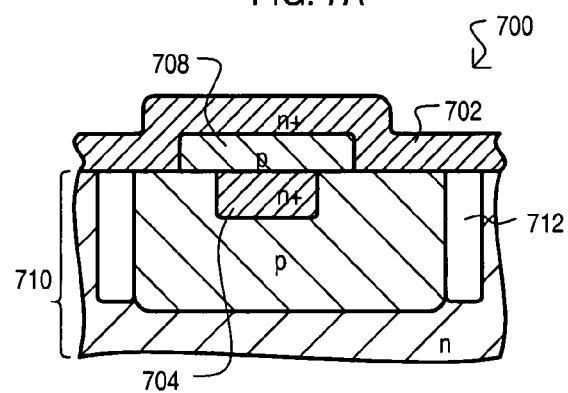

Referring now to FIGS. 7A and 7B, a storage cell according to a seventh embodiment is shown in a series of views, and designated by the general reference character 700. FIGS. 7A and 7B show the same general views as FIGS. 6A and 6B. Further, a storage cell 700 can include some of the same general structures as storage cell 600. Accordingly, like structures will be referred to by the same reference character but with the first digit being a "7" instead of a "6".

Storage cell 700 can differ from that of FIGS. 6A and 6B, in that a store gate 704 can be formed in a substrate 710, in an arrangement similar to that of FIG. 4B. However, source/drains (706-0 and 706-1) and channel region 708 can be portions of a first semiconductor layer formed over a surface of a substrate 710, with channel region 708 being in contact with store gate 704. In addition, a control gate 702 can be formed from a portion of a second semiconductor layer formed over the first semiconductor layer.

Figure 8A:
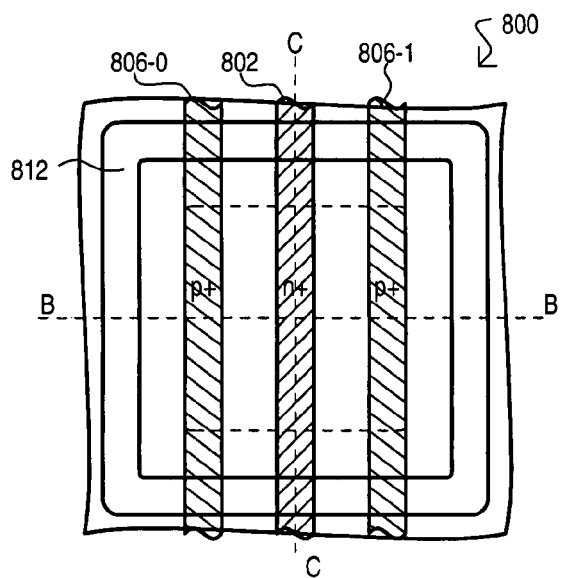
FIGS. 8A to 8C are various views showing a storage cell according to an eighth embodiment of the present invention.
Figure 8B:
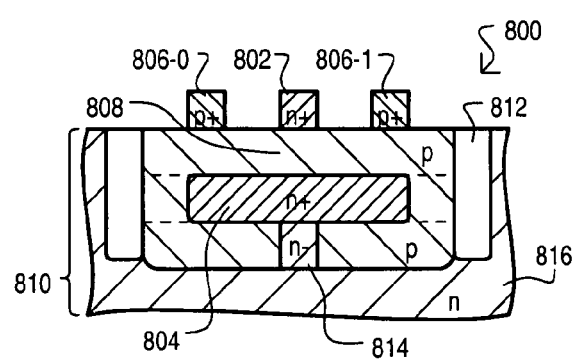
Figure 8C:
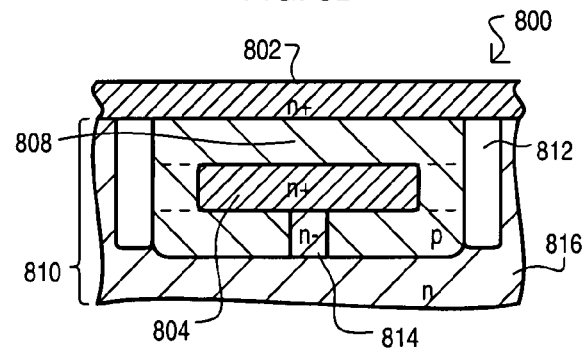

Referring now to FIGS. 8A to 8C, a storage cell according to an eighth embodiment is shown in a series of views, and designated by the general reference character 800. FIGS. 8A to 8C show the same general views as FIGS. 1A to 1C. Further, a storage cell 800 can include some of the same general structures as storage cell 100. Accordingly, like structures will be referred to by the same reference character but with the first digit being an "8" instead of a "1".

Storage cell 800 can differ from that of FIGS. 1A to 1C in that it can include a discharge channel 814. A discharge channel 814 can be formed from a semiconductor material formed between a store gate 804 and a bulk portion 816. A discharge channel 814 can be lightly doped to the same conductivity type as a store gate 804. A bulk portion 816 can be doped to the same conductivity type as store gate 804, but at a higher concentration than that of discharge channel 814. A bulk portion 816 can be a starting monocrystalline substrate, or can be a well formed within a substrate by a doping step, such as an ion implantation step.

As will be described in more detail below, a discharge channel 814 can serve to discharge store gate 804 to bulk portion 816. Discharge channel 814 can operate as the channel of a JFET device (oriented in the vertical direction). When charge is to be preserved on store gate 804, a discharge channel 814 can be non-conducting. When a store gate 804 is to be discharged, discharge channel 814 can be conducting. The state of discharge channel 814 (i.e., conducting/non-conducting) can be controlled by application of voltages to either or both of source/drains 806-0, 806-1.

As in the cases of the embodiments above, while FIGS. 8A to 8C show storage cells having a p-channel JFET configuration with an n-channel vertical discharge JFET, other embodiments can include an n-channel JFET configuration with a p-channel vertical discharge JFET, by switching the conductivity types of regions to types opposite to that shown in FIGS. 8A to 8C.

It is noted that in structures like those shown in FIGS. 1A to 8C, storage cell structures can be repeated adjacent to one another to provide compact memory arrays. For example, in the case of storage cell 100 shown in FIGS. 1A to 1C, control gate 102 can be one a contiguous structure extending across multiple storage cells to form a common word line. Similarly, either or both of source/drains (106-0 and/or 106-1) can extend in a similar fashion to provide a common source line or bit line for multiple storage cells. Such an arrangement can provide for compact arrays designs.

Of course, in alternate embodiments, a control gate and/or source/drain need not extend over an isolation structure, and can be formed entirely within an active area region. Such structures can then be connected to other structures by one or more layers of contacts, vias and/or interconnect wirings.

Referring now to FIGS. 9A and 9B, storage cells according to embodiments shown above are represented in schematic diagram form. FIG. 8A shows a p-channel variation of a storage cell 900, and FIG. 8B shows an n-channel variation of a storage cell 950. Schematic diagram 900 can correspond to structures shown in FIGS. 1A to 7B, and storage cell 900 includes labels to corresponding structures, with the first digit being a "9" instead of any of 1 to 7. Storage cell 950 can correspond to the structures of FIGS. 1A to 7B, but with opposite conductivities.

Referring now to FIGS. 10A and 10B, schematic diagrams of storage cells according to other embodiments are shown. FIG. 10A shows a p-channel variation of a storage cell 1000, and FIG. 10B shows an n-channel variation of a storage cell 1050. Schematic diagram 1000 can correspond to structures shown in FIGS. 8A to 8C. Thus, storage cell 1000 includes labels to corresponding structures, with the first digit being a "10" instead of any of an "8". Storage cell 1050 can correspond to the structures of FIGS. 8A to 8C, but with opposite conductivities.

FIG. 11A shows a schematic symbol for a p-channel storage cell according to embodiments described herein and equivalents. FIG. 11B shows a schematic symbol for an n-channel storage cell according to embodiments described herein and equivalents.

While the above embodiments have described storage cells according to various embodiments, other embodiments can include storage cell operating methods. Particular embodiments directed to various operations will now be described.

A write method according to an embodiment can include applying a voltage to a control gate that results in "punchthrough" to a store gate. That is, a voltage can be applied to a control gate that causes a depletion region to form in an oppositely doped region between a control gate and store gate. Such a voltage is sufficient to cause the depletion region to extend to the store gate (the punchthrough state) creating a conductive channel from the control gate to the store gate. As a result, a store gate can be charged according to the potential applied to the control gate.

In the embodiments described herein, a storage cell having a store gate charged by a punchthrough write operation that results in an increase of channel resistance will be considered to store a value "0". A storage cell having a discharged store gate resulting in lower channel resistance than charged store gate will be considered to store a value "1".

Referring now to FIGS. 12A and 12B, one very particular example of a "write 0" operation for storage cell like that of FIGS. 1A to 1C is shown in a series of side cross sectional views. The storage cell shown and corresponding structures are labeled with the same reference characters at FIG. 1B.

FIG. 12A shows a storage cell 100 just prior to punchthrough. Because storage cell 100 is an n-channel type, a positive voltage can be applied to n-type control gate 102 to create a depletion region 1200-0 within channel region 108, while a negative voltage can be applied to second source/drain region 106-1. A control gate voltage at this time can be less than that required for punchthrough, thus a depletion region 1200-0 does not yet extend to a store gate 104.

FIG. 12B shows a storage cell 100 in a punchthrough state. A control gate 102 and source voltage is now sufficient to create depletion region 1200-1 that extends through channel region 108 to store gate 104. Consequently, store gate 104 can be charged (in this case to a more positive potential).

In the particular example of FIGS. 12A and 12B, during such a write operation, first source/drain 106-0 and second source/drain 106-1 can be maintained at potentials or states that can enable punchthrough to occur at a desired control gate voltage.

The example of FIGS. 12A and 12B sets forth particular voltages and states for a write operation, with punchthrough control gate voltage being about +5.0 V, a source being about −5.0 V, and a drain maintained at 0 V or placed into a high impedance state. However, such particular potentials are provided by way of example only. One skilled the art would recognize punchthrough voltages will vary according to any of: doping concentrations, storage cell dimensions, particular source/drain states or potentials, as well as other factors.

Of course, a write operation like that shown in FIGS. 12A and 12B could be implemented in the same general fashion for storage cells having other structures described herein, and equivalents. As but one example, in an n-channel storage cell, a negative voltage would be applied to a control gate.

While embodiments of the present invention can include methods for writing one data state (e.g., a "0") to a storage cell, it may also be desirable to "de-select" other storage cells from such a write operation, to thereby enable different values to be written into a row of storage cells having a common control gate. A possible write de-select operation will now be described.

A write de-select operation according to an embodiment can include applying a same control gate voltage as a write "0" operation. However, fields can be created that prevent significant amounts of charge from accumulating on a store gate or prevent a depletion region from reaching a store gate.

Referring now to FIG. 13, a particular example of possible "write 1 de-select" operation for a storage cell like that of FIGS. 1A to 1C is shown in a side cross sectional view. The structures of the storage cell shown are labeled with the same reference characters as FIG. 1B.

As in the "write 1" operation described above, a positive voltage can be applied to n-type control gate 102 to create a depletion region within channel region 108. However, at the same time, a potential applied to source 106-1 is insufficient to allow charge to accumulate on store gate 104 or is not sufficient to allow a depletion region 1300-0 to reach store gate 104.

The example of FIG. 13 sets forth particular voltages and states for a write 0 de-select operation, with punchthrough control gate voltage being about +5.0 V, a source being driven to a de-select voltage of 0 V, while a drain is maintained at 0 V or placed into a high impedance state. However, such particular potentials are provided by way of example only. One skilled the art would recognize that a punchthrough suppression voltage would vary according to any of: doping concentrations, storage cell dimensions, and/or to particular source/drain states or potentials.

In this way, a data value (e.g., "0") can be selectively written to storage cells.

While embodiments of the present invention can include methods for selectively writing one data value (e.g., a "0"), embodiments of the present invention can also include methods for storing such a data state.

A store operation according to an embodiment can include applying voltages to a control gate, source and drain, that can tend to preserve a charge state of a store gate.

Referring now to FIG. 14, an example of a store operation for a storage cell like that of FIGS. 1A to 1C is shown in a series of side cross sectional views. The storage cell shown and corresponding structures are labeled with the same reference characters as FIG. 1B.

FIG. 14 can represent a storage cell following a write "0" operation, like that shown in FIGS. 12A and 12B. A voltage applied to control gate 102 can be less than that for punchthrough. As a result, a charge placed on store gate 104 can create a depletion region 1400 that extends into channel region 108. Such a depletion region 1400 can increase a channel resistance over that resulting from a discharged store gate.

The example of FIG. 14 shows particular voltages and states for a store operation. A control gate voltage can be about +1.0 V, a source being driven to 0 V, and a drain can be maintained at 0 V or placed into a high impedance state. However, such particular potentials are provided by way of example only.

While embodiments of the present invention can include methods for writing one data state (e.g., a "0"), other embodiments can include methods for writing the opposite data state (e.g., a "1").

A write 1 operation according to an embodiment can include forward biasing a pn junction created by a store gate, and a channel region and source (or drain). A resulting forward biased pn junction can create a discharge path that allows charge to transfer away from the store gate.

Referring now to FIG. 15, one very particular example of a "write 1" operation for a storage cell like that of FIGS. 1A to 1C is shown in a side cross sectional view. The storage cell shown and corresponding structures are labeled with the same reference characters as FIG. 1B.

In the write operation of FIG. 15, a voltage can be applied to second source/drain 106-1 that forward biases a pn junction created by a store gate 104 (n part of junction) and a channel 108 and second source/drain 106-1 (p part of junction).

This can create charge travel path 1502. As a result, assuming a storage cell 100 previously stored a value "0", a depletion region created by store gate 102 can shrink from a previous state 1400 to a "store 1" state 1500.

The example of FIG. 15 shows particular voltages and states for a write 1 operation. A control gate voltage can be about 0V, a drain can be maintained at 0 V or placed into a high impedance state, while a source can be driven to a voltage sufficient to forward bias the pn junction, which in this example is +1.0 V. However, such particular potentials are provided by way of example only.

Of course, a write operation like that shown in FIG. 15 could be implemented in the same general fashion for storage cells having other structures described herein, and equivalents. As but one example, in an n-channel storage cell, a negative voltage could be applied to a source or drain to create a desired forward bias condition.

Embodiments of the invention can also include a store operation for value "1". FIG. 16 shows such an operation. FIG. 16 can include the same items as FIG. 14. However, a store gate 104 does not produce a significant depletion region extending into channel region 108.

While embodiments of the invention can include write, write de-select, and store operations, the embodiments can also include read operations.

In a read operation according to an embodiment, a potential can be created between a source and drain. A resulting current flowing between the source and drain can be measured. If a channel resistance is relatively high, resulting in less current, a storage cell can be understood to store a value "0", as a store gate depletion region will extend into the channel region. If a channel resistance is relatively low, resulting in more current, a storage cell can be understood to store a value "1", as a store gate will create essentially no depletion region within the channel region.

Referring now to FIG. 17A a read operation for a storage cell storing a value "0" is shown in a side cross sectional view. FIG. 17A shows storage cell like that of FIGS. 1A to 1C, thus like structures are labeled with the same reference characters as FIG. 1B.

In the read operation of FIG. 17A, a first source/drain node 106-0 can be placed at a higher potential than a second source/drain node 106-1. A control gate 104 can receive a voltage that can additionally limit current through a channel region 108. As shown FIG. 17A, a channel region 108 can include a resistance Rch. Because store gate 104 is charged and creates a depletion region 1400, resistance Rch can be relatively high, and draw a current $I_0$.

The example of FIG. 17A shows a control gate voltage from 0 to +1.0 V, a drain voltage of +0.5 V, and a source voltage of 0V. However, such particular potentials are provided by way of example only. At the same time, it is noted that a drain potential must not exceed the forward bias potential of the pn junction created by drain 106-0, channel 108 and store gate 104, or store gate 104 can discharge.

Referring now to FIG. 17B, a read operation for a storage cell storing a value "1" is shown in a side cross sectional view. FIG. 17B shows storage cell like that of FIGS. 1A to 1C, thus like structures are labeled with the same reference characters as FIG. 1B.

The read operation of FIG. 17B includes the same application of potentials as FIG. 17A. However, because store gate 104 is not charged, essentially no depletion region 1500 extends into channel region 108, and resistance Rch can be relatively low, and draw a current $I_1$, which can be detectably larger than current $I_0$.

In this way a stored data value can be determined according to a variation in channel resistance.

While embodiments of the present invention can include methods for reading a data state from a storage cell, it can be desirable to "de-select" a storage cell from a read operation, to thereby enable different values to be read from storage cells having a common drain and/or source connection.

A read de-select operation according to an embodiment can include preventing or significantly reducing a current from flowing through a channel of a de-selected storage cell. Thus, a de-selected storage cell can draw an insignificant amount of current in a read operation.

Referring now to FIGS. 18A and 18B, two particular examples of possible "read de-select" operations for a storage cell like that of FIGS. 1A to 1C are shown in side cross sectional views. The storage cell shown and corresponding structures are labeled with the same reference characters as FIG. 1B.

FIG. 18A shows a first example of a read de-select operation. As is the case of a selected storage cell like that of FIGS. 17A and 17B, a first source/drain node 106-0 can be placed at a bias potential and control gate 104 can receive a voltage that can additionally limit current through a channel region 108. However, unlike the arrangement of FIGS. 17A and 17B, a second source/drain node 106-1 can be placed into a high impedance state. As a result, little or no current can flow through a channel region 108. Accordingly, the de-s elected storage cell 100 can contribute little or no current when a storage cell connected to a same drain node is selected for a read operation.

FIG. 18B shows a second example of a read de-select operation. As is the case of a selected storage cell like that of FIGS. 17A and 17B, a first source/drain node 106-0 can be placed at a bias potential and second source/drain node 106-1 can be placed at ground, creating a potential across a channel region 108. To limit current through channel region 108, a de-select gate voltage can be applied to control gate 104. A de-select voltage can result in a depletion layer being formed in channel region 108, thereby significantly reducing current drawn by the deselected cell.

The example of FIG. 18B shows a control gate de-select voltage of about +3.0 V. However, such a particular potential is provided by way of example only. A gate de-select voltage can vary according to doping and storage cell size. However, a control gate de-select voltage should be of sufficiently small enough in magnitude to prevent punchthrough.

In this way, a data value can be selectively read from storage cells.

The various operations shown in FIGS. 12A to 18B are described with reference to a structure like that shown in FIG. 1A to 1C. However, the same or similar operations can occur for other described structures. A few possible examples will now be described.

A store operation for structures like that shown in FIGS. 2A to 2C are shown in FIGS. 19 and 20. The storage cell shown and corresponding structures are labeled with the same reference characters at FIG. 2B.

FIG. 19 can represent a storage cell following a write "0" operation, like that shown in FIGS. 12A and 12B. Charge placed on store gate 204 can create a depletion region 1900 that extends into channel region 208. Such a depletion region 1400 can increase a channel resistance over that resulting from a discharged store gate.

Referring to FIG. 20, a store operation for a value "1" like that of FIG. 19 is shown in the same view. Because store gate 104 is discharged, a channel resistance can be lower than that resulting from a charged store gate.

For a structure like that shown in FIGS. 2A to 2C, write 0 operations, write 0 de-select operations, and write 1 operations can occur the same ways as described above.

Store operations and write operations for a structure like that shown in FIGS. 8A to 8C are shown in FIGS. 21 to 23. It will be recalled that storage cell 800 includes a discharge channel 814 that extends from a store gate 804 to a bulk portion 816.

Referring now to FIG. 21, an example of a store operation for a storage cell like that of FIGS. 8A to 8C is shown in a series of side cross sectional views. The storage cell shown and corresponding structures are labeled with the same reference characters as FIG. 8B.

FIG. 21 can represent a storage cell following a write "0" operation, like that shown in FIGS. 12A and 12B. Charge placed on store gate 804 can create a depletion region 2100 that extends into channel region 808. Such a depletion region 2100 can increase a channel resistance over that resulting from a discharged store gate. At the same time, store potentials applied at first and/or second source/drains (806-0 and 806-1) can ensure that discharge path 814 remains pinched off. That is, the potential of p-type region containing channel 808 can deplete discharge path 814, and thus place it in a high resistance state that can prevent store gate 804 from discharging to bulk portion 816.

The example of FIG. 21 shows the application of a store voltage of 0 V to first and second source/drains (806-0 and 806-1). However, such a particular potential is provided by way of example only. Such a store voltage can vary according to doping, storage cell size, and discharge channel size. For example, a negative voltage might also be suitable for maintaining a discharge channel in the off (i.e., non-conducting) state.

According to one embodiment, a write "1" operation can include enabling a discharge path between a store gate and a bulk portion in which the storage cell is formed. Such a discharge path allows the store gate to discharge to the bulk portion.

This is in contrast to the approach shown in FIG. 15, in which forward biases a pn junction that includes a store gate.

Referring now to FIG. 22, an example of a write "1" operation for a storage cell like that of FIGS. 8A to 8C is shown in a series of side cross sectional views. The storage cell shown and corresponding structures are labeled with the same reference characters as FIG. 8B.

In the write operation of FIG. 22, a store voltage applied at a first and/or second source/drain (806-0, 806-1) that has previously pinched off discharge path 814, can be changed to enable discharge path 814. For example, in the case of the p-channel device illustrated, a voltage applied to first and/or second source/drain (806-0, 806-1) can be increased. (In the case of an n-channel device a store voltage would be decreased). As a result, discharge path 814 can be placed into a low impedance state, creating charge travel path 2202. It is assumed that bulk portion 816 is biased to a potential sufficient to draw charge off of store gate 804.

The example of FIG. 22 shows particular voltages for a write 1 operation. A control gate voltage can be about 0 V, a drain and source can be switched from about 0 V to about +0.5 V. However, such particular potentials are provided by way of example only. However, source/drain voltages should remain sufficiently small to prevent a forward bias condition with a store gate.

FIG. 23 shows a store operation for value "1" in a structure like that of FIGS. 8A to 8C. FIG. 23 can include the same items as FIG. 21. However, a store gate 804 does not produce a significant depletion region into a channel 808.

As understood from the structures described above, other embodiments can include store gates positioned in a lateral direction with respect to control gate. Operations for such structures will now be described.

Various operations for a storage cell structure like that shown in FIGS. 4A and 4B are shown in a series of side cross sectional views in FIGS. 24A to 24D. The storage cell shown and corresponding structures are labeled with the same reference characters as FIG. 4B.

FIG. 24A shows a write "0" operation. Such an operation can be like that described above in FIG. 12B, however a punchthrough depletion region 2400-0 can extend in a lateral direction to store gate 404.

FIG. 24B shows a write "0" de-select operation. Such an operation can be like that described above in FIG. 13A, however a depletion region 2400-1 does not reach store gate 404 or the control gate and source potentials are not sufficient to introduce significant amounts of charge onto store gate 404.

FIG. 24C shows a store "0" operation. Such an operation can be like that described above in FIG. 14, however a depletion region 2400-2 extends downward into channel region 408. It is understood that a store "1" operation can have the same configuration, but a depletion region will not substantially affect the resistance of a corresponding channel region.

FIG. 24D shows a write "1" operation. Such an operation can be like that described above in FIG. 15.

Various operations for a storage cell structure like that shown in FIGS. 5A and 5B are shown in a series of side cross sectional views in FIGS. 25A to 25D. The storage cell shown and corresponding structures are labeled with the same reference characters as FIG. 5B.

FIG. 25A shows a write "0" operation. Such an operation can be like that described above in FIG. 12B, however a punchthrough depletion region 2500-0 can extend in a lateral direction to store gate 504.

FIG. 25B shows a write "0" de-select operation. Such an operation can be like that described above in FIG. 13A, however a depletion region 2500-1 does not reach store gate 504 or the control gate and source potentials are not sufficient to introduce significant amounts of charge onto store gate 504.

FIG. 25C shows a store "0" operation. Such an operation can be like that described above in FIG. 14, however a depletion region 2500-2 extends downward into channel region 508 from above a surface of substrate 501. It is understood that a store "1" operation can have the same configuration, but a depletion region does not substantially affect the resistance of the channel region.

FIG. 25D shows a write "1" operation. Such an operation can be like that described above in FIG. 15.

In this way, storage cells that include a store gate and JFET with a control gate formed on a substrate surface can have data values selectively written by charging a store gate, can store such data values, and can have such data values read.

Having described storage cell structures and methods of operation according various embodiments, embodiments directed to memory device architectures including such storage cells will now be described.

Figure 26:
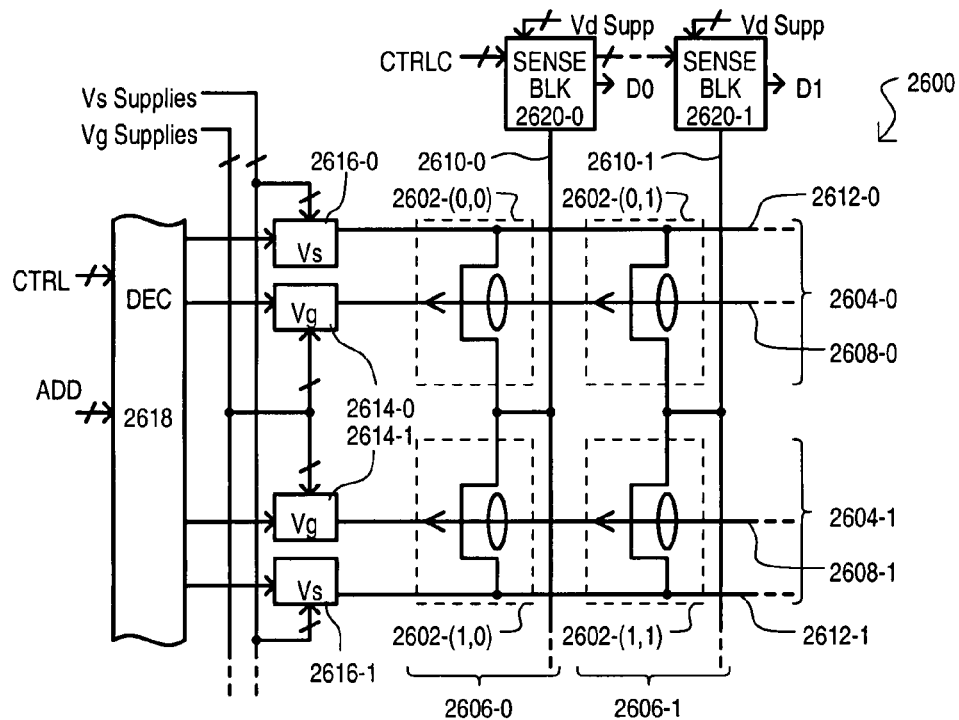
FIG. 26 shows a memory device according to an embodiment.

Referring now to FIG. 26 a memory device according to one embodiment is shown in a schematic diagram and designated by the general reference character 2600. A memory device 2600 can include a number of storage cells 2602-(0,0) to 2602-(1,1) arranged into rows 2604-0/1 and columns 2606-0/1. Storage cells of a same row can have control gates commonly connected by a word line 2608-0 and 2608-1. Storage cells of a same column can have drains commonly connected by a bit line 2610-0 and 2610-1. In the very particular example of FIG. 26, Storage cells of a same row can also have sources commonly connected by a source line 2612-0 and 2612-1.

A memory device 2600 can further include gate switch circuits 2614-0/1, source switch circuits 2616-0/1, a row decoder 2618, and sense blocks 2620-0/1. Gate switch circuits 2614-0/1 can receive gate supply voltages (Vg Supplies) and selectively apply such voltages to control gates of storage cells on a row-by-row basis according to control signals received from row decoder 2618. For example, gate voltages can be applied that are suitable for any of the operations described above, including but not limited to: a write "0" operation, a write "0" de-select operation, a write "1" operation, a store operation, and a read operation.

In a similar fashion, source switch circuits 2616-0/1 can receive source supply voltages (Vs Supplies) and selectively apply such voltages to sources of storage cells on a row-by-row basis according to control signals received from row decoder 2618. In addition, source switch circuits 2616-0/1 can create a high impedance state for sources of the corresponding storage cells. For example, voltages can be applied to the sources, or the sources placed into a high impedance state suitable for any of the operations described above, including but not limited to: a write "0" operation, a write "0" de-select operation, a write "1" operation, a store operation, and a read operation.

A row decoder 2618 can receive address values ADD as well as control values CTRL, and in response thereto, control the operation of gate switch circuits 2614-0/1 and source switch circuits 2616-0/1. More particularly, according to such received values, a row decoder 2618 can distinguish between types of row operations, allowing writes to one row, while write de-selecting other rows and/or allowing reads from one row, while read de-selecting other rows.

Sense blocks 2620-0/1 can each be connected to a corresponding bit line 2610-0/1 and can sense a current flowing through such a bit line, to thereby determine a state of a selected storage cell. In addition, each sense block 2620-0/1 can receive drain supply voltages (Vd Supp) and selectively apply such voltages to drains of storage cells on a column-by-column basis according to column control values CTRLC. In addition, sense blocks 2620-0/1 can create a high impedance state for drains of corresponding storage cells is required by an operation.

In this way, storage cells can be arranged into an array to form a memory device.

Figure 27:
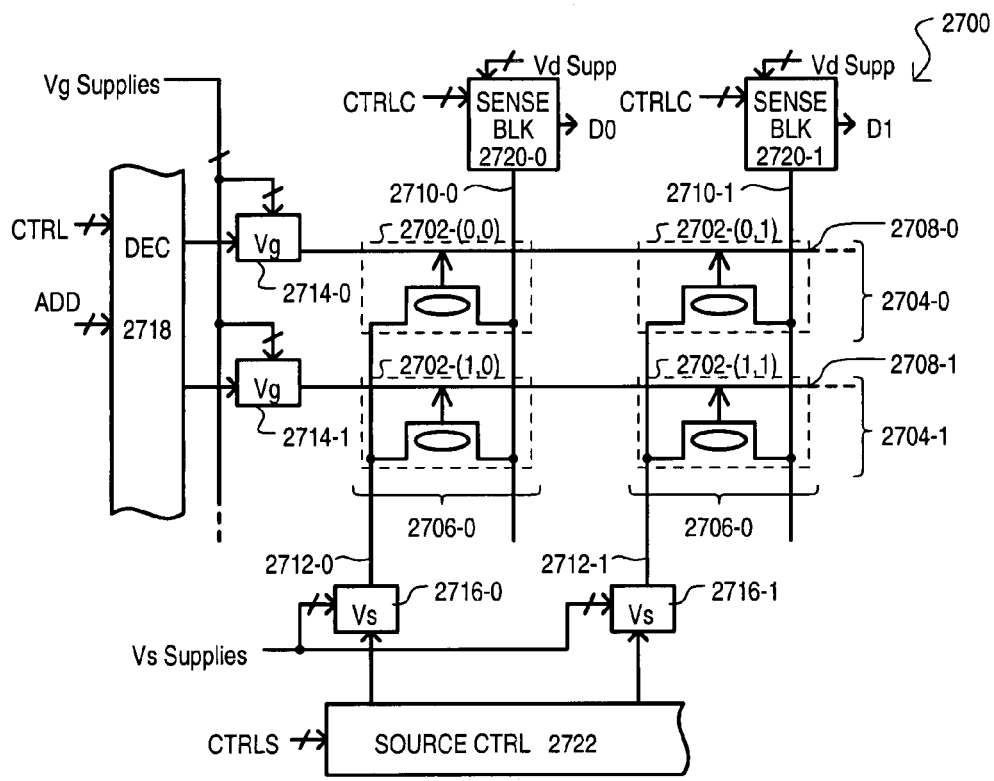
FIG. 27 shows a memory device according to another embodiment.

Referring now to FIG. 27 a memory device according to another embodiment is shown in a schematic diagram and designated by the general reference character 2700. A memory device 2700 can include many of the same general circuit sections as that of FIG. 26, accordingly, like sections are referred to by the same reference character but with the first two digits being "27" instead of "26".

Memory device 2700 can differ from that of FIG. 26 in that storage cells of a same column can have sources commonly connected by a source line 2712-0 and 2712-1, rather than storage cells of the same row.

In addition, source switch circuits 2716-0/1 can be controlled by a source control circuit 2722. A source control circuit 2722 can receive control values CTRLS, and in response thereto, control source switch circuits 2716-0/1. According to such received values, a source control circuit 2722 can distinguish between column operations, allowing writes to one column, while write de-selecting other columns and/or allowing reads from one column, while read de-selecting other columns.

Referring now to FIG. 28 a memory device according to another embodiment is shown in a schematic diagram and designated by the general reference character 2800. A memory device 2800 can include many of the same general circuit sections as that of FIG. 27, accordingly, like sections are referred to by the same reference character but with the first two digits being "28" instead of "27".

Memory device 2800 can differ from that of FIG. 27 in that storage cells from multiple rows and columns can have sources commonly connected to a common source 2824, rather than storage cells of the same column. Such an arrangement can allow storage cells to be written to in a group fashion. Even more particularly, a write "1" operation can executed simultaneously on multiple rows and columns in a similar fashion to a "flash" erase, commonly employed in electrically erasable programmable read only memory (EEPROM) type devices.

Of course, while the above memory device embodiments have shown arrays with p-channel type storage cells, alternate embodiments can include n-channel type storage cells.

In this way, storage cells can be arranged into an array to form various memory device architectures, including those that can access storage cells in a row-by-row basis, column-by-column basis, or multiple row and column basis.

Referring now to FIG. 29, one example of a sense block that can be included in the embodiments of FIGS. 26-28 is shown in a block schematic diagram and designated by the general reference character 2900. A sense block 2900 can include a drain switch circuit 2902 and a sense amplifier 2904 connected to a bit line 2906. A drain switch circuit 2902 can receive drain supply voltages (Vd Supp) and selectively apply such voltages to bit line 2906 according to control signals CTRLD. For example, voltages can be applied to or a high impedance state created that are suitable for any of the operations described above, including but not limited to: a write "0" operation, a write "0" de-select operation, a write "1" operation, a store operation, and a read operation.

A sense amplifier 2904 can determine a read data value D based on a current drawn by bit line 2906. One example of a sense amplifier circuit that can be included in a sense block like that of FIG. 29 is shown in a schematic diagram in FIG. 30.

Referring now to FIG. 30, a sense amplifier circuit 3000 is shown with reference to a selected storage cell 3002. A selected storage cell 3002 can draw a current Isense that can vary according to a stored data state. Current Isense can flow through a bit line 3004. In the particular example shown, a sense amplifier circuit 3000 can include a load 3006 and an amplifier 3008. A load 3006 can be an active or passive load, and can be connected directly, or by way of a switch to bit line 3004. Amplifier 3008 can have one input connected to load 3006 at node 3010 and another input that receives a reference voltage Vref. A reference voltage Vref can be generated with a voltage reference circuit, or can be based on a current drawn by another storage cell operating as a "dummy" storage cell. When a current Isense is of sufficient magnitude (e.g., storage cell 3002 stores a "1"), a potential at node 3010 with vary from voltage Vref, resulting in amplifier 3008 outputting one value (e.g., 1). When a current Isense is below a certain magnitude (e.g., storage cell 3002 stores a "0"), a potential at node 3010 with vary from voltage Vref in the opposite direction, resulting in amplifier 3008 outputting another value (e.g., 0).

While memory devices according to the embodiments can include bit lines each connected to a corresponding sense block, one sense block can be shared among multiple bits lines. One such arrangement is shown in FIG. 31.

Referring now to FIG. 31 a memory device according to another one embodiment is shown in a schematic diagram and designated by the general reference character 3100. A memory device 3100 can include many of the same general circuit sections as that of FIG. 26, accordingly, like sections are referred to by the same reference character but with the first two digits being "31" instead of "26".

Memory device 3100 shows a column decoder circuit 3126. A column decoder circuit 3126 can selectively connect a bit line (e.g., 3110-0 or 3110-1 ) to a sense block 3120 according to address values COLADD.

In this way a memory device can share a sense block among multiple columns.

While the above embodiments have shown a memory device in which storage cells are composed of single JFET type devices, alternate embodiments can include storage cells having both store devices and pass devices. One particular example of such an arrangement is shown in FIGS. 32 and 33.

Figure 32:
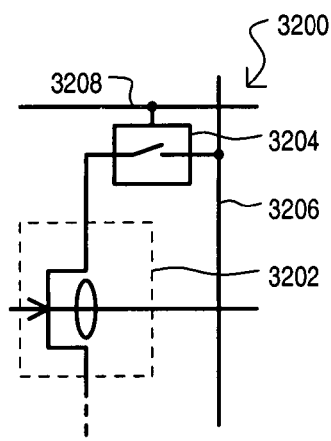
FIG. 32 is a schematic diagram of a storage cell according to an alternate embodiment of the invention.

Referring now to FIG. 32, a storage cell according to one embodiment is shown in a schematic diagram and designated by the general reference character 3200. A storage cell 3200 can include a storage device 3202 and a pass device 3204. A storage device 3202 can include any of the storage structures described above and equivalents. Thus, a storage device 3202 can provide a current path having a resistance that can vary according to a stores state.

A pass device 3204 can provide a conductive path between a storage device 3202 and a bit line 3206 that is controlled according to a word line 3208. In this way, a pass device 3204 can isolate a storage device 3202 from a bit line 3206. While a pass device 3204 can take a variety of forms, including an insulated gate field effect transistor, a pass device can preferably be a JFET device. One example of such an arrangement is shown in FIG. 33.

Figure 33:
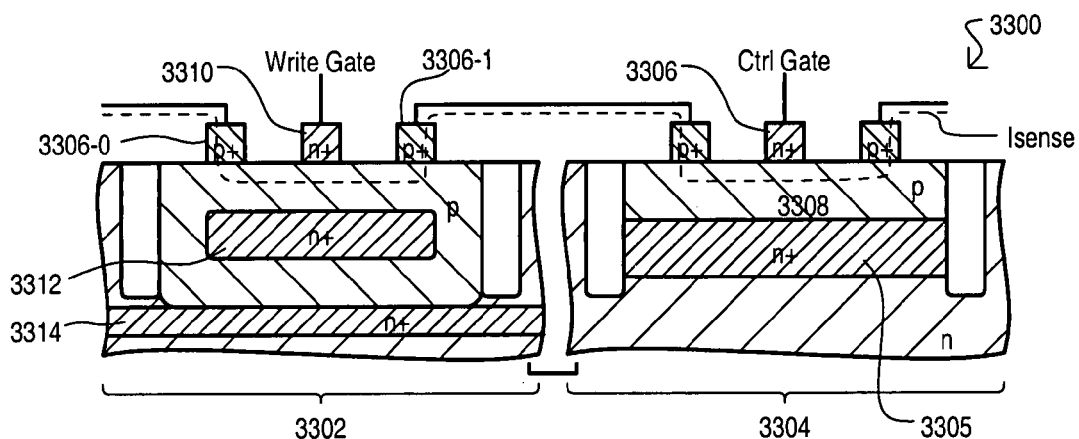
FIG. 33 is a side cross sectional view showing one example of a storage cell like that shown in FIG. 32.

FIG. 33 shows devices of a storage cell 3300 in a side cross sectional view. A storage cell 3300 can include a storage device 3302 and a pass JFET 3304. In the example shown, a storage device 3302 can have the same construction as that shown in FIGS. 1A to 1C. A pass JFET 3304 can have a structure like that of FIGS. 1A to 1C, but does not include a store gate, and has a shallower channel region. In addition, a pass JFET 3304 can optionally include a back gate 3305.

It is noted that in an arrangement like that of FIG. 33, a pass JFET 3304 can include a control gate 3306 and a pass channel region 3308. Thus, in such a storage cell 3300, a control gate 3306 may exist on a different device. At the same time, a channel region can include pass channel region 3308 and store channel region 3308'.

A storage device 3302 can have a write gate 3310 that can enable write and other operations to occur to store gate 3312. However, alternatively, in a storage cell like that of FIGS. 32/33, a storage device 3302 may not include a program gate 3310. Instead, a store gate 3312 can be written to value "0", by way of a bottom gate 3314 (or bulk portion), and then selectively written to a value "1" via pass JFET 3304 providing a forward biasing voltage to either of source/drains 3306-0 and 3306-1.

In this way, a storage cell can include a control gate formed on a pass device.

As noted above, while storage cells according to the above embodiments can include store gates that can retain charge for longer periods of time than many conventional DRAMs, such charge cannot be retained indefinitely. Accordingly, a memory device according to the embodiments can include refresh operations and circuits. Refresh operations and circuits can read a stored value, and then rewrite such a value back into the storage cell. One example of a refresh arrangement is shown in FIGS. 34A to 34C.

Referring now to FIGS. 34A to 34C, a memory device 3400 is shown a schematic diagram, and can include some of the same items as FIG. 26, thus like items are referred to by the same reference character but with the first digits being "34"

instead of "26". Again, while p-channel storage cells are shown, alternate arrangements can include n-channel type storage cells.

Referring to FIG. 34A, a refresh operation can first include reading and latching values stored in one row 3404-0, while other rows (e.g., 3404-1) are de-selected from the read operation. Sense blocks 3420-0 and 3420-1 can determine a stored value, and then store such values in corresponding latches (3430-0 and 3430-1). In the particular example shown, storage cell 3402-(0,0) stores a "0", thus such a value is read by sense block 3420-0 and stored by latch 3430-0. Similarly, storage cell 3402-(0,1) stores a "1", thus such a value is read by sense block 3420-1 and stored in latch 3430-1. Because row 3404-1 is de-selected, no values are read or stored for storage cells 3402-(1,0) and 3402-(1,1).

Once data values to be refreshed have been latched, such values can be restored. In the particular example shown, such an operation can be a two-step operation, with one data value being written to an entire row, and subsequently, a second value being selectively written to particular cells of the row.

Referring to FIG. 34B, in the particular example shown, data values "1" can be written to all storage cells of a previously read (and latched) row. Such an operation can include any of the previously described write "1" operations. Because row 3404-1 is de-selected from such a write operation, data values stored within storage cells 3402-(1,0) and 3402-(1,1) are not affected by such a step.

Referring to FIG. 34C, in the particular example shown, a data value "0" can be selectively written to a storage cell according to the data value previously latched. Thus, in FIG. 34C, a data value "0" can be written into a storage cell 3402-(0,0), while storage cell 3402-(0,1) can be de-selected from such a write operation, and thus retain a data value "1". Because row 3404-1 is de-selected, no values are written into storage cells 3402-(1,0) and 3402-(1,1).

In this way, data values can be refreshed.

Refresh operations can be periodically performed based upon a data retention time of the corresponding storage cells. Refresh operations can be based on a timer circuit, or the like, that ensures a refresh operation occurs within a data retention time of a storage cell.

Figure 35:
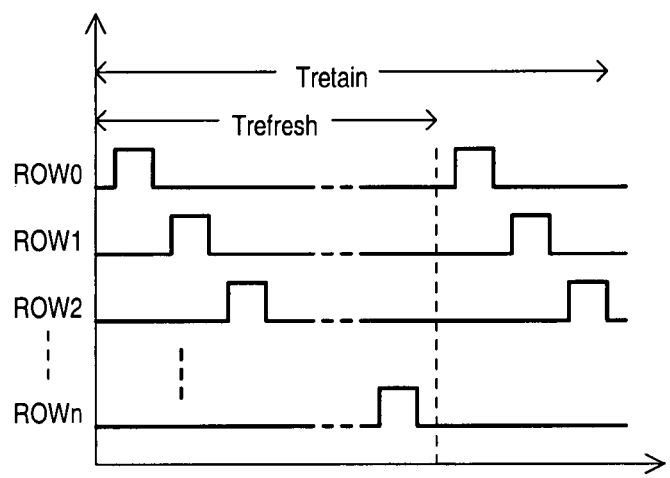
FIG. 35 is a timing diagram showing refresh timing according to an embodiment.

Referring now to FIG. 35, a refresh operation according to an embodiment is shown in a timing diagram. Refresh operations for n+1 rows are executed according to refresh signals ROW0 to ROWn. All rows can refreshed within a time period Trefresh. A time period Trefresh can be larger than a time Tretain, which can represent a data retention time of a storage cell. Preferably, a value Trefresh can be well within a value Tretain, to account for worst case data retention times of corresponding storage cells.

In this way storage cells can be periodically refreshed based on a data retention time.

While embodiments of the present invention can include structures, circuits and operations according to the various embodiments, other embodiments can include methods of fabricating devices. Examples of such methods will now be described with reference to FIGS. 36A to 36G.

Referring now to FIGS. 36A to 36G, methods of forming storage cells are shown in a series of side cross sectional views. FIGS. 36A to 36G show the formation of a storage cell having a p-channel conductivity type, however, alternate arrangements can form different conductivity type devices using dopings of opposite conductivity type.

Figure 36A:
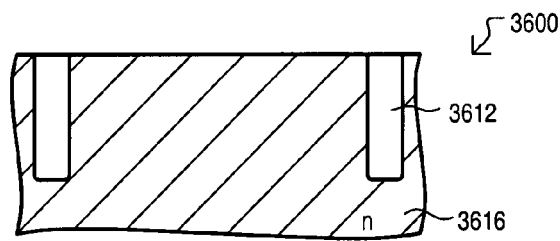
FIG. 36A to 36G are side cross sectional views showing manufacturing methods according to embodiments.

Referring now to FIG. 36A, an integrated circuit device 3600 can include a substrate having an isolation structure 3612 formed in a bulk portion 3616 that defines an active area for the formation of a storage cell. In one very particular arrangement, an isolation structure 3612 can be formed with shallow trench isolation (STI) techniques. Optionally, an active area can be subject to a substrate (e.g., bulk) doping adjustment step, such as an ion implantation step. A bulk portion 3616 can be a semiconductor material doped to a conductivity type opposite to that of a channel region. Thus, in the example of FIG. 36A, a bulk portion 3616 can be doped to an n-type conductivity.

Figure 36B:
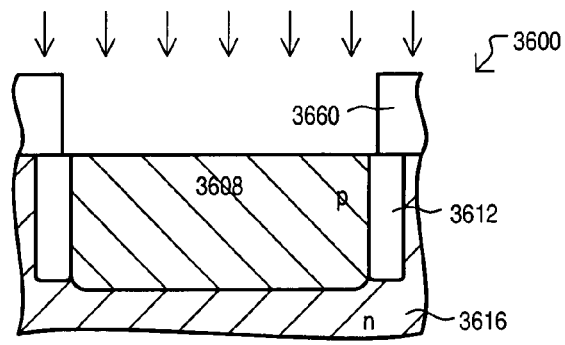

Referring now to FIG. 36B, a storage cell channel region 3608 can be formed. A channel region 3608 can create a channel that can have a resistance that varies according to a charge of a store gate. In addition, a channel region can help ensure that a store gate does not contact any other oppositely doped semiconductor region, such as bulk portion 3616 or a control gate. In the particular example shown, a channel mask 3660 can be formed that exposes regions where a channel is to be formed. Impurities can be implanted to produce a channel region 3608 having a desired conductivity type and concentration. In the example of FIGS. 36A to 36G, a storage cell is of a p-channel type, thus, such a step can include implanting p-type impurities.

Figure 36C:
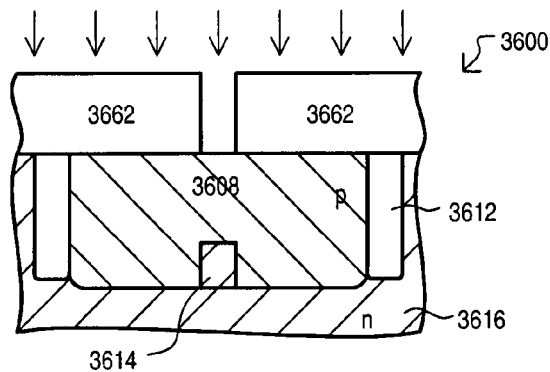

Referring now to FIG. 36C, a method an optionally include forming a discharge channel 3614. In particular, a method can include this step to form a storage cell like that shown in FIGS. 8A to 8C. As noted above, a discharge channel 3614 can allow a store gate to be discharged to a bulk portion 3616. In the particular example shown, a discharge path mask 3662 can be formed that exposes regions where a discharge channel is to be formed. Impurities can be implanted to produce a discharge channel 3614 having a desired conductivity type and concentration. Further, implantation energies can be selected to ensure that discharge channel 3614 can be formed within the vertical extents necessary to extend from a bulk portion 3616 to a subsequently formed store gate.

A method can also include forming a store gate within a channel region. Two possible store gate formation steps are shown in FIGS. 36D-0 and 36D-1.

Figures 0, 1, 36D:
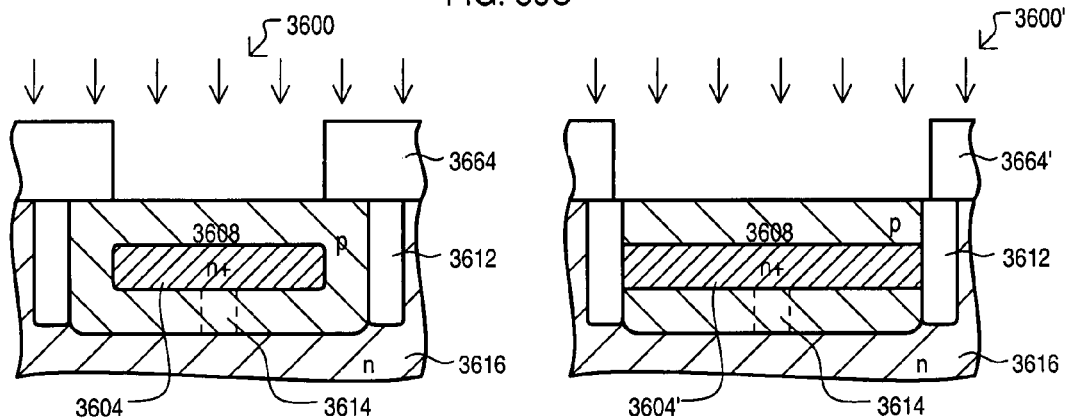

Referring now to FIG. 36D-0, a method for forming a store gate like that shown in FIGS. 1A to 1C is shown in a side cross sectional view. A store gate mask 3664 can be formed that exposes regions where a store gate is to be formed. Impurities can be implanted that produce a store gate 3604 having a desired conductivity type and concentration. Implantation energies can be selected to ensure that store gate 3604 can be formed within the necessary vertical extents. That is, a store gate 3604 can be formed that will not contact a bulk portion 3616 or a control gate.

Referring now to FIG. 36D-1, a method for forming a store gate like that shown in FIGS. 2A to 2C is shown in a side cross sectional view. FIG. 36D-1 shows the same general step as that shown in FIG. 36D-0, but a store gate mask 3664' can be formed that allows a store gate to formed that can extend between opposing ends an isolation structure 3612.

FIGS. 36D-0 and 36D-1 also show where a discharge channel 3614 can be included, if desired.

Figure 36E:
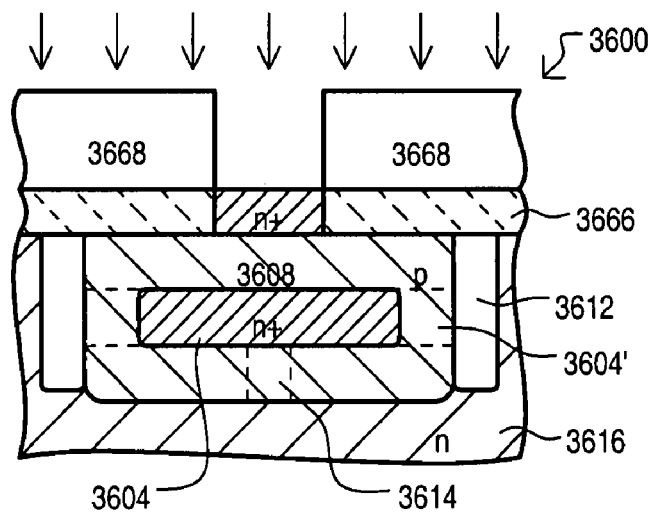

Referring now to FIG. 36E, a semiconductor electrode material 3666 can be formed over a substrate. An electrode material 3666 can be a material capable of forming a pn junction with a channel region 3608. In one particular example, an electrode material 3666 can be silicon, preferably polycrystalline silicon (polysilicon), formed over and in contact with a channel region 3608. In the particular example of FIG. 36E, an electrode material 3666 can be doped to form a control gate electrode for a storage cell. Accordingly, a source/drain mask 3668 can be formed over portions of electrode material 3666 from which a source or drain electrodes are to be formed. Areas exposed by source/drain mask 3668 can be subject to an implantation step to form a control gate electrode having the opposite conductivity type as channel region 3608 (in this particular example, n-type).

Figure 36F:
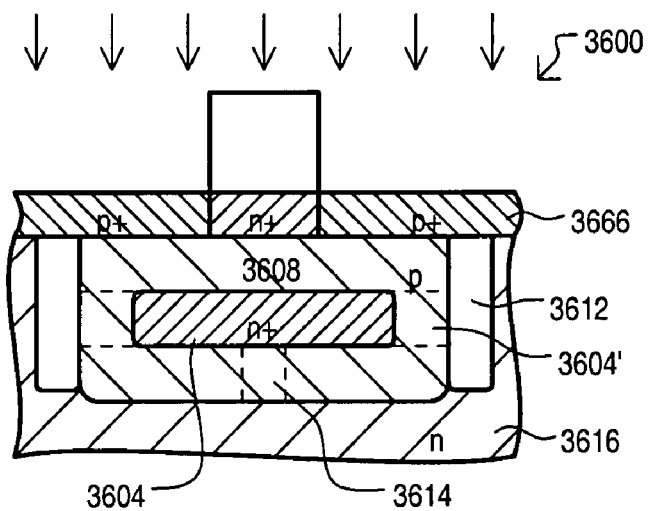

Referring to FIG. 36F, an electrode material 3666 can be doped to form source and drain electrodes for a storage cell. Accordingly, a gate mask 3668 can be formed over portions of an electrode material 3666 from which a gate electrode is to be formed. Areas exposed by gate mask 3668 can be subject to an implantation step that forms source and drain electrodes having the same conductivity type as the respective channel region 3608 (in this particular example, p-type).

Figure 36G:
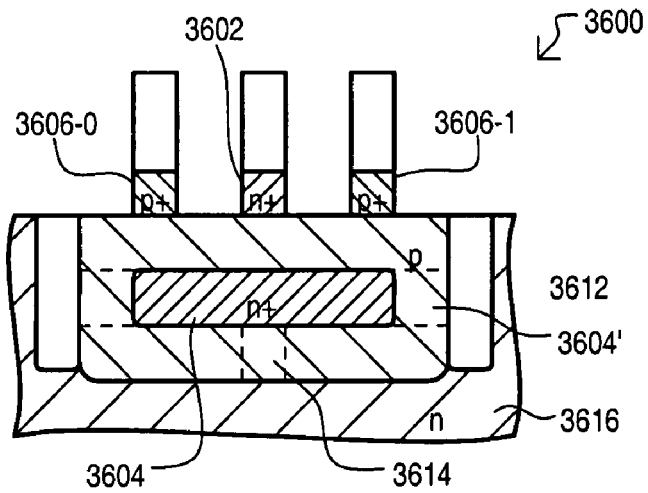

Referring now to FIG. 36G, an electrode material 3666 can be subject to an electrode patterning step. Such a step can include etching doped electrode material 3666 into electrode structures, and one embodiment, can be a reactive ion etch. In addition, a more conductive layer could be formed over semiconductor material 3666, such a silicide layer. This more conductive layer can be formed prior to, or after electrodes are patterned. Subsequently, a storage cell 3600 could be subject to heat treatment step that can cause impurities to outdiffuse from electrodes into a substrate below. In the very particular example of FIG. 36G, an electrode patterning step can form a control gate 3602, a first source/drain 3606-0 and a second source/drain 3606-1.

In this way, storage cells that include a store gate and JFET device can be formed in a same substrate. Further, gate, source and drain electrodes for such a storage cell can be formed with a same semiconductor layer.

While the various embodiments described above have shown arrangements in which source/drains include electrodes formed above a substrate surface. Alternate embodiments can include source/drains formed by diffusion regions within a substrate. One such arrangement is shown in FIGS. 37A to 37C.

Figure 37A:
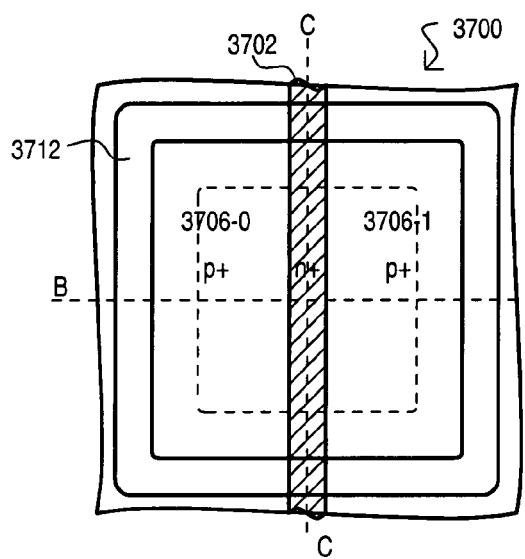
FIGS. 37A to 37C are various views showing a storage cell according to yet another embodiment of the present invention.
Figure 37B:
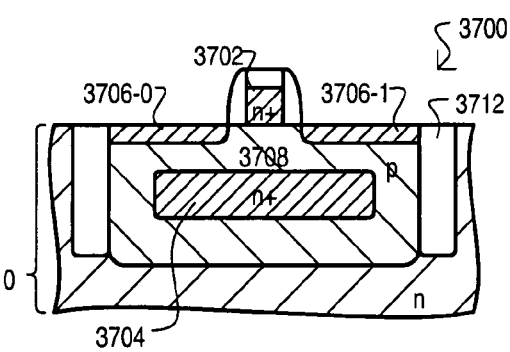
Figure 37C:
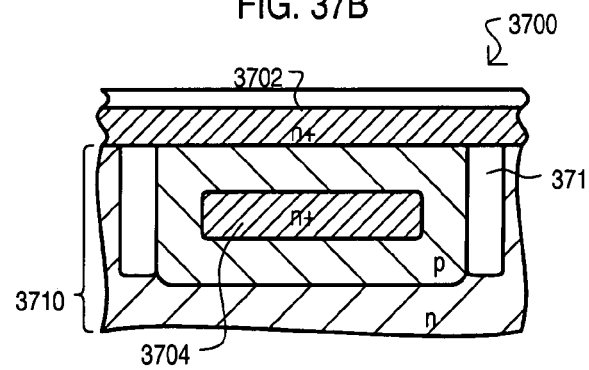

Referring to FIGS. 37A to 37C, a storage cell according to another embodiment is shown in a series of views, and designated by the general reference character 3700. FIGS. 37A to 37C show the same general views as FIGS. 1A to 1C. Further, a storage cell 3700 can include some of the same general structures as storage cell 100. Accordingly, like structures will be referred to by the same reference character but with the first digits being "37" instead of a "1".

Storage cell 3700 can differ from that of FIGS. 1A to 1C in that a first source/drain 3706-0 and second source/drain 3706-1 can be formed by diffusion regions within substrate 3710. As but one example, such source/drains (3706-0 and 3706-1) can be formed by an ion implantation step that is self-aligned with control gate 3702.

In this way, a storage cell according to an embodiment can include one or more diffused source/drains.

Reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is, an inventive feature of the invention may include an elimination of an element.

While various particular embodiments set forth herein have been described in detail, the present invention could be subject to various changes, substitutions, and alterations without departing from the spirit and scope of the invention.

What is claimed is:

1. A semiconductor device, comprising:
at least one storage cell, comprising:
a store gate structure formed from a semiconductor material doped to a first conductivity type and in contact with a channel region comprising a semiconductor material doped to a second conductivity type;
at least a first source/drain region and a second source/drain region separated from one another by the channel region; and
a control gate structure, comprising a semiconductor layer doped to the first conductivity type and formed over a substrate surface, the control gate structure being in contact with the channel region, and further including:
a discharge channel comprising a semiconductor region doped to the first conductivity type that contacts the store gate and a bulk region comprising a semiconductor material doped to the first conductivity type, the discharge channel having a dopant concentration less than that of the store gate and the bulk region.

2. The semiconductor device of claim 1, wherein:
the substrate comprises a semiconductor material; and
the store gate structure is formed within the substrate.

3. The semiconductor device of claim 2, further including:
an isolation structure formed in the substrate; and
a portion of the store gate is in contact with the isolation structure.

4. The semiconductor device of claim 2, wherein:
the store gate is formed below the substrate surface.

5. The semiconductor device of claim 4, wherein:
the store gate is surrounded by semiconductor material doped to the second conductivity type.

6. The semiconductor device of claim 1, wherein:
the at least first source/drain region comprises a semiconductor layer doped to the second conductivity type and formed over and in contact with the substrate surface.

7. The semiconductor device of claim 6, wherein:
the at least first source/drain region and control gate structure comprise structures patterned from a same semiconductor layer.

8. The semiconductor device of claim 1, wherein:
the at least first source/drain region comprises a portion of the substrate doped to the first conductivity type and having a higher dopant concentration than the channel region.

9. The semiconductor device of claim 1, wherein:
the control gate structure is formed over the store gate structure in a direction perpendicular to the substrate surface.

10. The semiconductor device of claim 1, wherein:
the at least one storage cell includes a plurality of storage cells arranged into at least one row, the storage cells of the same row having control gates structures commonly connected to a conductive word line.

11. The semiconductor device of claim 10, wherein:
the control gates and word line of the same row comprise a contiguous structure patterned from a same semiconductor layer.

12. The semiconductor device of claim 10, further including:
the plurality of storage cells are arranged into multiple rows, each row having a corresponding word line; and
a row decoder that selectively provides gate voltages to the word lines in response to at least a portion of a received address value.

13. The semiconductor device of claim 10, wherein:
the plurality of storage cells are further arranged into at least one column, the storage cells of the same column having at least first source/drain regions commonly connected to a bit line.

14. The semiconductor device of claim 13, wherein:
the plurality of storage cells are arranged into multiple columns, each column having a corresponding bit line; and
a column decoder that selectively couples the bit lines to a common node in response to at least a portion of a received address value.

15. The semiconductor device of claim 13, wherein:
the storage cells of the same column having at least second source/drain regions commonly connected to a source line.

16. The semiconductor device of claim 13, further including:
a current sense amplifier coupled to the bit line that generates a data value based on the magnitude of a current drawn by the bit line.

17. The semiconductor device of claim 13, further including:
a refresh latch coupled to each bit line that stores a data value read from a corresponding storage cell coupled to the bit line; and
a sense block circuit coupled to the refresh latch that applies a potential to the bit line in a write operation according to the data value stored in the refresh latch.

* * * * *

UNITED STATES PATENT AND TRADEMARK OFFICE
CERTIFICATE OF CORRECTION

PATENT NO. : 7,692,220 B2  Page 1 of 1
APPLICATION NO. : 11/799572
DATED : April 6, 2010
INVENTOR(S) : Madhu B. Vora It is certified that error appears in the above-identified patent and that said Letters Patent is hereby corrected as shown below:

IN THE TITLE PAGE:

At field (75) Inventor, please replace "Madhu P. Vora" with "Madhu B. Vora" so that the corresponding field reads:

-- (75) Inventor: Madhu B. Vora, Los Gatos, CA (US) --

At field (56) References Cited, under OTHER PUBLICATIONS, please replace "Vora, Madhukar P." with "Vora, Madhu B." so that the corresponding field reads:

-- U.S. Appl. No. 11/799,572, Vora, Madhu B. --

Signed and Sealed this

Twenty-first Day of September, 2010

David J. Kappos
*Director of the United States Patent and Trademark Office*